(12) United States Patent
Cho et al.

(10) Patent No.: US 11,587,980 B2
(45) Date of Patent: Feb. 21, 2023

(54) DISPLAY DEVICE

(71) Applicant: Samsung Display Co., LTD., Yongin-si (KR)

(72) Inventors: Hyeon Gu Cho, Yongin-si (KR); Min Soo Choi, Yongin-si (KR); Seok Gyu Yoon, Yongin-si (KR); Jae Jin Lyu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 266 days.

(21) Appl. No.: 16/829,649

(22) Filed: Mar. 25, 2020

(65) Prior Publication Data

US 2021/0036060 A1 Feb. 4, 2021

(30) Foreign Application Priority Data

Jul. 30, 2019 (KR) .................. 10-2019-0092490

(51) Int. Cl.
*H01L 27/28* (2006.01)
*G09G 3/20* (2006.01)
(Continued)

(52) U.S. Cl.
CPC ......... *H01L 27/288* (2013.01); *G09G 3/2003* (2013.01); *G09G 3/3208* (2013.01);
(Continued)

(58) Field of Classification Search
CPC ... H01L 27/288; H01L 27/307; H01L 27/322; H01L 27/3244; H01L 51/0059;
(Continued)

(56) References Cited

U.S. PATENT DOCUMENTS 7,364,960 B2 * 4/2008 Lyu .................. H01L 27/14689
257/E21.189
10,048,538 B1 8/2018 Fukuoka et al.
(Continued)

FOREIGN PATENT DOCUMENTS

EP 3 462 498 4/2019
KR 10-2015-0032028 3/2015
WO 2018/197987 11/2018

OTHER PUBLICATIONS

Samsung Newsroom, "Samsung Electronics Becomes the World's First in Mass Production of the Transparent LCD Panel", Website Mar. 15, 2011, URL: https://www.flickr.com/photos/samsungtomorrow/5576581534.
(Continued)

*Primary Examiner* — Sardis F Azongha
(74) *Attorney, Agent, or Firm* — Kile Park Reed & Houtteman PLLC

(57) ABSTRACT

A display device includes a display substrate, a light emitting element layer disposed on a surface of the display substrate and including display pixels, a sensing substrate having a surface attached to another surface of the display substrate, a sensing element layer disposed on another surface of the sensing substrate and including sending pixels that each sense light of a color, and a photorefractive layer disposed on the sensing element layer and including micro lenses.

26 Claims, 28 Drawing Sheets

(51) Int. Cl.
  *G09G 3/3208* (2016.01)
  *H01L 27/30* (2006.01)
  *H01L 27/32* (2006.01)
  *H01L 51/44* (2006.01)
  *H01L 51/00* (2006.01)
  *H01L 51/52* (2006.01)
  *H04N 5/225* (2006.01)

(52) U.S. Cl.
  CPC .......... *H01L 27/307* (2013.01); *H01L 27/322* (2013.01); *H01L 27/3244* (2013.01); *H01L 51/007* (2013.01); *H01L 51/0059* (2013.01); *H01L 51/0072* (2013.01); *H01L 51/0078* (2013.01); *H01L 51/0097* (2013.01); *H01L 51/447* (2013.01); *H01L 51/5253* (2013.01); *H01L 51/5268* (2013.01); *H04N 5/2257* (2013.01); *G09G 2320/02* (2013.01); *H01L 2251/5338* (2013.01); *H01L 2251/5369* (2013.01)

(58) Field of Classification Search
  CPC ............. H01L 51/0078; H01L 51/0072; H01L 51/0097; H01L 51/447; H01L 51/5253; H01L 51/5268; G09G 3/2003; G09G 3/3208; H04N 5/2257
  See application file for complete search history.

(56) References Cited

U.S. PATENT DOCUMENTS

| | | | |
|---|---|---|---|
| 10,176,749 B2 | 1/2019 | Ades | |
| 10,189,398 B2 | 1/2019 | Jung et al. | |
| 10,204,456 B2 | 2/2019 | Kudirka et al. | |
| 10,720,607 B2 * | 7/2020 | Song | H01L 51/5265 |
| 11,057,551 B2 * | 7/2021 | Nishide | H01L 27/3234 |
| 2006/0125387 A1 * | 6/2006 | Adachi | H01L 51/5268 313/506 |
| 2012/0249829 A1 * | 10/2012 | Izuha | H01L 27/14623 348/E5.037 |
| 2013/0194199 A1 * | 8/2013 | Lynch | G06F 3/0421 445/24 |
| 2016/0037098 A1 * | 2/2016 | Lee | H01L 27/307 257/292 |
| 2018/0203316 A1 | 7/2018 | Xu | |
| 2018/0203475 A1 | 7/2018 | Van Derven et al. | |
| 2018/0205022 A1 | 7/2018 | Dyatkin et al. | |
| 2018/0208615 A1 | 7/2018 | Lin et al. | |
| 2018/0210489 A1 | 7/2018 | Boisard et al. | |
| 2018/0212162 A1 | 7/2018 | Boudreault et al. | |
| 2018/0212163 A1 | 7/2018 | Lin et al. | |
| 2018/0212165 A1 | 7/2018 | Ji | |
| 2018/0213762 A1 | 8/2018 | Peters | |
| 2018/0217378 A1 | 8/2018 | Wang et al. | |
| 2018/0217388 A1 | 8/2018 | Laack et al. | |
| 2018/0217429 A1 | 8/2018 | Busch | |
| 2018/0217678 A1 | 8/2018 | Yun et al. | |
| 2018/0218545 A1 | 8/2018 | Garcia et al. | |
| 2018/0224662 A1 | 8/2018 | Yu et al. | |
| 2018/0224678 A1 | 8/2018 | Jung et al. | |
| 2018/0226049 A1 | 8/2018 | Lee et al. | |
| 2018/0230173 A1 | 8/2018 | Ji et al. | |
| 2018/0231837 A1 | 8/2018 | Fukuoka et al. | |
| 2018/0231862 A1 | 8/2018 | An et al. | |
| 2018/0232189 A1 | 8/2018 | Yang et al. | |
| 2018/0233668 A1 | 8/2018 | Dyatkin et al. | |
| 2018/0235384 A1 | 8/2018 | Kacius et al. | |
| 2018/0237211 A1 | 8/2018 | Goldmeier | |
| 2018/0237463 A1 | 8/2018 | Zeng et al. | |
| 2018/0239155 A1 | 8/2018 | Wang et al. | |
| 2018/0239423 A1 | 8/2018 | Mardanbegi et al. | |
| 2018/0240418 A1 | 8/2018 | Kobayashi | |
| 2018/0240438 A1 | 8/2018 | Lee et al. | |
| 2018/0240987 A1 | 8/2018 | Ji et al. | |
| 2018/0246698 A1 | 8/2018 | Huang | |
| 2018/0247607 A1 | 8/2018 | Cho | |
| 2018/0252931 A1 | 9/2018 | Kim-Whitty | |
| 2018/0252932 A1 | 9/2018 | Tan et al. | |
| 2018/0253165 A1 | 9/2018 | Feng | |
| 2018/0253900 A1 | 9/2018 | Finding et al. | |
| 2018/0254417 A1 | 9/2018 | Ma et al. | |
| 2018/0255285 A1 | 9/2018 | Hall et al. | |
| 2018/0258118 A1 | 9/2018 | Zeng et al. | |
| 2018/0259781 A1 | 9/2018 | Ou Yang et al. | |
| 2018/0259782 A1 | 9/2018 | Newton | |
| 2018/0260021 A1 | 9/2018 | Mullen | |
| 2018/0261010 A1 | 9/2018 | Kudirka et al. | |
| 2018/0261014 A1 | 9/2018 | Seo et al. | |
| 2018/0261661 A1 | 9/2018 | Jin | |
| 2018/0261793 A1 | 9/2018 | Fitzgerald et al. | |
| 2018/0267230 A1 | 9/2018 | Takagi | |
| 2018/0267313 A1 | 9/2018 | Kim et al. | |
| 2018/0267603 A1 | 9/2018 | Bastian et al. | |
| 2018/0267615 A1 | 9/2018 | Freeman et al. | |
| 2018/0267766 A1 | 9/2018 | Min et al. | |
| 2018/0268218 A1 | 9/2018 | Watanabe | |
| 2018/0268568 A1 | 9/2018 | Kim-Whitty | |
| 2018/0268754 A1 | 9/2018 | Kim et al. | |
| 2018/0272224 A1 | 9/2018 | Chen et al. | |
| 2018/0274852 A1 | 9/2018 | Kang et al. | |
| 2018/0275464 A1 | 9/2018 | Wang et al. | |
| 2018/0277592 A1 | 9/2018 | Moon et al. | |
| 2018/0277773 A1 | 9/2018 | Ji et al. | |
| 2018/0277774 A1 | 9/2018 | Boudreault et al. | |
| 2018/0277775 A1 | 9/2018 | Xia et al. | |
| 2018/0277776 A1 | 9/2018 | Szigethy et al. | |
| 2018/0281309 A1 | 10/2018 | Herrmann et al. | |
| 2018/0281671 A1 | 10/2018 | Na et al. | |
| 2018/0281689 A1 | 10/2018 | Cha et al. | |
| 2018/0282356 A1 | 10/2018 | Ji et al. | |
| 2018/0282357 A1 | 10/2018 | Chen | |
| 2018/0284342 A1 | 10/2018 | Cao et al. | |
| 2018/0284452 A1 | 10/2018 | Eroma et al. | |
| 2018/0284532 A1 | 10/2018 | Wang | |
| 2018/0284540 A1 | 10/2018 | Wang et al. | |
| 2018/0284932 A1 | 10/2018 | Nehmad | |
| 2018/0286131 A1 | 10/2018 | Friesen | |
| 2018/0287075 A1 | 10/2018 | Tsai et al. | |
| 2018/0287076 A1 | 10/2018 | Tsai et al. | |
| 2018/0287077 A1 | 10/2018 | Joseph et al. | |
| 2018/0287079 A1 | 10/2018 | Wolohan et al. | |
| 2018/0287087 A1 | 10/2018 | Thompson et al. | |
| 2018/0287088 A1 | 10/2018 | Ji et al. | |
| 2018/0288333 A1 | 10/2018 | Vanblon et al. | |
| 2018/0288518 A1 | 10/2018 | Schmidt et al. | |
| 2018/0290584 A1 | 10/2018 | Jung et al. | |
| 2018/0292886 A1 | 10/2018 | Chataignier et al. | |
| 2018/0292967 A1 | 10/2018 | Lee et al. | |
| 2018/0293039 A1 | 10/2018 | Bostick et al. | |
| 2018/0293931 A1 | 10/2018 | Ades | |
| 2018/0294420 A1 | 10/2018 | Feldman et al. | |
| 2018/0294421 A1 | 10/2018 | Wolohan | |
| 2018/0297540 A1 | 10/2018 | Juhasz | |
| 2018/0299991 A1 | 10/2018 | Juhasz et al. | |
| 2018/0301096 A1 | 10/2018 | Yoon et al. | |
| 2018/0301639 A1 | 10/2018 | Zeng et al. | |
| 2018/0302684 A1 | 10/2018 | Sansom et al. | |
| 2018/0305384 A1 | 10/2018 | Chen et al. | |
| 2018/0305385 A1 | 10/2018 | Chen et al. | |
| 2018/0307317 A1 | 10/2018 | Ananthapur Bache et al. | |
| 2018/0307320 A1 | 10/2018 | Ananthapur Bache et al. | |
| 2018/0309067 A1 | 10/2018 | Wolohan et al. | |
| 2018/0312514 A1 | 11/2018 | Ma et al. | |
| 2018/0314066 A1 | 11/2018 | Bell et al. | |
| 2018/0314353 A1 | 11/2018 | Chan | |
| 2018/0315250 A1 | 11/2018 | Poulos et al. | |
| 2018/0315942 A1 | 11/2018 | Wolohan et al. | |
| 2018/0317670 A1 | 11/2018 | Kuboshima | |
| 2018/0319830 A1 | 11/2018 | Szigethy | |
| 2018/0319831 A1 | 11/2018 | Ji et al. | |
| 2018/0322708 A1 | 11/2018 | Luccin et al. | |
| 2018/0324229 A1 | 11/2018 | Ross et al. | |
| 2018/0328563 A1 | 11/2018 | Park | |

(56) References Cited

U.S. PATENT DOCUMENTS

| | | |
|---|---|---|
| 2018/0329493 A1 | 11/2018 | Khoshkava |
| 2018/0330531 A1 | 11/2018 | Mullins |
| 2018/0331291 A1 | 11/2018 | Lu et al. |
| 2018/0331304 A1 | 11/2018 | Ma et al. |
| 2018/0331306 A1 | 11/2018 | Chen et al. |
| 2018/0332335 A1 | 11/2018 | Mullins |
| 2018/0334101 A1 | 11/2018 | Tschirhart |
| 2018/0334262 A1 | 11/2018 | Descheemaeker et al. |
| 2018/0334462 A1 | 11/2018 | Dyatkin et al. |
| 2018/0335833 A1 | 11/2018 | Mullen |
| 2018/0337342 A1 | 11/2018 | Su et al. |
| 2018/0337343 A1 | 11/2018 | Wolohan |
| 2018/0337344 A1 | 11/2018 | Lin et al. |
| 2018/0337351 A1 | 11/2018 | Feldman et al. |
| 2018/0338122 A1 | 11/2018 | Travis |
| 2018/0342188 A1 | 11/2018 | Wang |
| 2018/0345867 A1 | 12/2018 | Imamura et al. |
| 2018/0348881 A1 | 12/2018 | Chung |
| 2018/0349957 A1 | 12/2018 | Kim-Whitty |
| 2018/0351102 A1 | 12/2018 | Wolohan et al. |
| 2018/0356584 A1 | 12/2018 | Masuda |
| 2018/0357942 A1 | 12/2018 | Lin et al. |
| 2018/0357943 A1 | 12/2018 | Wang |
| 2018/0365893 A1 | 12/2018 | Mullins |
| 2018/0366678 A1 | 12/2018 | Chi et al. |
| 2018/0367756 A1 | 12/2018 | Wang |
| 2018/0367769 A1 | 12/2018 | Greenberg |
| 2018/0368240 A1 | 12/2018 | Dunn et al. |
| 2018/0370944 A1 | 12/2018 | Wolohan |
| 2018/0370978 A1 | 12/2018 | Wolohan |
| 2018/0370979 A1 | 12/2018 | Feldman |
| 2018/0370999 A1 | 12/2018 | Tsai et al. |
| 2018/0372936 A1 | 12/2018 | Auger et al. |
| 2018/0373340 A1 | 12/2018 | Cheng et al. |
| 2018/0373937 A1 | 12/2018 | Shulman |
| 2018/0374453 A1 | 12/2018 | Verble |
| 2018/0375036 A1 | 12/2018 | Chen et al. |
| 2018/0375037 A1 | 12/2018 | Chen et al. |
| 2018/0375038 A1 | 12/2018 | Lu et al. |
| 2018/0375039 A1 | 12/2018 | Macinnis et al. |
| 2018/0375978 A1 | 12/2018 | Singh et al. |
| 2019/0001894 A1 | 1/2019 | Dai |
| 2019/0001987 A1 | 1/2019 | Kim et al. |
| 2019/0006446 A1 | 1/2019 | Chung et al. |
| 2019/0012704 A1 | 1/2019 | Lawrenson et al. |
| 2019/0013366 A1 | 1/2019 | Forrest et al. |
| 2019/0018636 A1 | 1/2019 | Kong et al. |
| 2019/0019308 A1 | 1/2019 | Iwata |
| 2019/0019812 A1 | 1/2019 | Shi |
| 2019/0025577 A1 | 1/2019 | Tamura et al. |
| 2019/0025673 A1 | 1/2019 | Pilliod et al. |
| 2019/0025881 A1 | 1/2019 | Franklin et al. |
| 2019/0026958 A1 | 1/2019 | Gausebeck et al. |
| 2019/0031027 A1 | 1/2019 | Pala et al. |
| 2019/0035011 A1 | 1/2019 | Ramos et al. |
| 2019/0035321 A1 | 1/2019 | Xu |
| 2019/0035338 A1 | 1/2019 | Du |
| 2019/0036031 A1 | 1/2019 | Wolohan et al. |
| 2019/0036040 A1 | 1/2019 | Su et al. |
| 2019/0036055 A1 | 1/2019 | Lin et al. |
| 2019/0036058 A1 | 1/2019 | Thompson et al. |
| 2019/0036059 A1 | 1/2019 | Ji et al. |
| 2019/0036060 A2 | 1/2019 | Forrest et al. |
| 2019/0037711 A1 | 1/2019 | Hong et al. |
| 2019/0038241 A1 | 2/2019 | Wilson et al. |
| 2019/0041669 A1 | 2/2019 | Jiang et al. |
| 2019/0042015 A1 | 2/2019 | Lee et al. |
| 2019/0042069 A1 | 2/2019 | Muto et al. |
| 2019/0043004 A1 | 2/2019 | Lesieur et al. |
| 2019/0043842 A1 | 2/2019 | Guo et al. |
| 2019/0044093 A1 | 2/2019 | Sargent et al. |
| 2019/0050071 A1 | 2/2019 | Liu et al. |
| 2019/0050900 A1 | 2/2019 | Avakian |
| 2019/0051829 A1 | 2/2019 | Wolohan |
| 2019/0051842 A1 | 2/2019 | Dyatkin et al. |
| 2019/0051843 A1 | 2/2019 | Wolohan |
| 2019/0051844 A1 | 2/2019 | Ji et al. |
| 2019/0051845 A1 | 2/2019 | Szigethy et al. |
| 2019/0053640 A1 | 2/2019 | Min |
| 2019/0057255 A1 | 2/2019 | Kuo et al. |
| 2019/0057647 A1 | 2/2019 | Hack |
| 2019/0058020 A1 | 2/2019 | Tsai et al. |
| 2019/0058136 A1 | 2/2019 | Macinnis et al. |
| 2019/0058138 A1 | 2/2019 | Knowles et al. |
| 2019/0058139 A1 | 2/2019 | Ma et al. |
| 2019/0058860 A1 | 2/2019 | Wang et al. |
| 2019/0064601 A1 | 2/2019 | Wei |
| 2019/0066607 A1 | 2/2019 | Mitchell |
| 2019/0067600 A1 | 2/2019 | Dyatkin et al. |
| 2019/0067601 A1 | 2/2019 | Ji et al. |
| 2019/0068529 A1 | 2/2019 | Mullins |
| 2020/0328259 A1 * | 10/2020 | Joe .................. G09G 3/3208 |

OTHER PUBLICATIONS

Samsung Display Newsroom, "[Learning Display Terms] 22. Transparent OLED", Website Jun. 7, 2019, URL: http://news.samsungdisplay.com/19351, with English translation.

* cited by examiner

DISPLAY DEVICE

CROSS-REFERENCE TO RELATED APPLICATION

This application claims priority to and benefits of Korean Patent Application No. 10-2019-0092490 under 35 U.S.C. § 119, filed in the Korean Intellectual Property Office on Jul. 30, 2019, the entire contents of which are incorporated herein by reference.

BACKGROUND

1. Field of the Invention

The invention relates to a display device.

2. Description of the Related Art

An organic light emitting diode display of a display device may display an image using an organic light emitting diode that generates light by electron-hole recombination. An organic light emitting display device may be a self-luminous display and has fast response speed and low power consumption, and has been spotlighted as a next generation display.

Since the organic light emitting display device may not need to include a backlight unit, a transparent display device in which a background of the display visible through a screen in a non-display state can be realized.

However, such a transparent display device may present challenges. For example, since the organic light emitting display device may be driven in a self-luminous manner, it may be difficult to express black in case that the transparent display device includes an opening. The black in the organic light emitting display device may be expressed by turning off an organic light emitting diode of a corresponding display pixel. However, with a transparent display device, a problem may occur that a back side of the transparent display device may be transmitted through the opening and viewed.

Accordingly, a transparent display device may not cover the background of the organic light emitting display device even though the user may not want to see behind the screen. Further, a transparent display device may even raise privacy issues.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein

SUMMARY

An embodiment of the invention provides a display device that may enable viewing behind the display device without including an opening.

An embodiment of the invention provides a display device that may be capable of improved representations of black.

Aspects of the invention are not limited to those described above, and other technical aspects that are not mentioned may be clearly understood to a person of an ordinary skill in the art using the following description.

A display device according to an embodiment of the invention may include a display substrate, and a light emitting element layer disposed on a surface of the display substrate and including display pixels. The display device may include a sensing substrate having a surface attached to another surface of the display substrate, and a sensing element layer disposed on another surface of the sensing substrate and including sensing pixels that each sense light of a color. The display device may include a photorefractive layer disposed on the sensing element layer and including micro lenses.

The display device may further include a color conversion element layer disposed on the light emitting element layer, wherein the color conversion element layer includes a wavelength conversion pattern including a quantum dot, and a color filter.

The display substrate and the sensing substrate may be flexible.

The display device may further include a first encapsulation layer disposed on the light emitting element layer; and a second encapsulation layer disposed between the sensing element layer and the photorefractive layer, wherein each of the first encapsulation layer and the second encapsulation layer includes a first inorganic layer, an organic layer, and a second inorganic layer.

At least one of the display substrate and the sensing substrate may be an opaque substrate.

The display pixels may include an organic light emitting diode, and the sensing pixels may include a photo diode.

The organic light emitting diode of the display pixels may emit blue light.

The organic light emitting diode and the photo diode may be formed in a same process.

The display device may further include a controller that controls the display pixels and the sensing pixels.

The controller may include an image processor that performs color processing on image data decoded from the sensing pixels and performs at least one of an image conversion and an image quality improvement.

The sensing pixels may include a first photoelectric conversion element that senses red light, a second photoelectric conversion element that senses green light, and a third photoelectric conversion element that senses blue light.

The first photoelectric conversion element may include phthalocyanine, the second photoelectric conversion element may include boron subphthalocyanine chloride or N, N-dimethyl quinacridone, and the third photoelectric conversion element may include triarylamines or oxadiazole-containing oligoaryls.

At least one of the micro lenses of the photorefractive layer may overlap at least one of the photoelectric conversion elements of the sensing pixels.

The display device may further include a color conversion filter disposed between the sensing element layer and the photorefractive layer.

The sensing pixels may absorb light of one color.

The color conversion filter may include a first color filter that selectively transmits light of a first color, a second color filter that selectively transmits light of a second color. And a third color filter that selectively transmits light of a third color.

The micro lenses may be manufactured by a photoresist method, a hot molding method, or a printing method.

Each of the sensing pixels may include a light sensing element of an organic CMOS image sensor.

A display device according to another embodiment of the invention may include a display surface formed on a surface of the display device and including a plurality of color areas defined by display pixels, and a sensing surface formed on another side of the display device and including a plurality of absorption areas defined by sensing pixels. Each of the display pixels may include a light emitting element. Each of the sensing pixels may include a photoelectric conversion element. A number of the display pixels may be equal to a number of the sensing pixels.

The display pixels may match one-to-one with the sensing pixels, and an image color collected by one of the sensing pixels may emit light through a corresponding one of the display pixels.

The display surface may include a display area and a non-display area surrounding the display area, the display area may include a light emitting area including the plurality of color areas and a non-light emitting area distinguishing the plurality of color areas.

The display device may not include in the display area a physical opening passing through the display device.

An area of the sensing surface may be less than an area of the display surface.

The plurality of color areas may include a first color area that selectively emits light of a first color, a second color area that selectively emits light of a second color, and a third color area that selectively emits light of a third color.

The first color area, the second color area, and the third color area may have different sizes with each other.

Sizes of the plurality of absorption areas may be substantially same each other and may be less than or equal to sizes of the plurality of color areas.

A display device according to another embodiment of the invention may include a base substrate, and a light emitting element layer disposed on a surface of the base substrate. The display device may include a color conversion element layer disposed on the light emitting element layer, and a sensing element layer disposed on another surface of the base substrate and including sensing pixels that may each sense light of a color. The display device may include a photorefractive layer disposed on the sensing element layer and including a micro lenses.

Particularities of other embodiments are included in the detailed description and drawings.

According to an embodiment of the invention, the display device can see a back side while representing a perfect black.

Effects of embodiments of the invention are not limited by what is illustrated in the above, and more various effects are included in the specification.

DETAILED DESCRIPTION OF THE EMBODIMENTS

Figure 1:
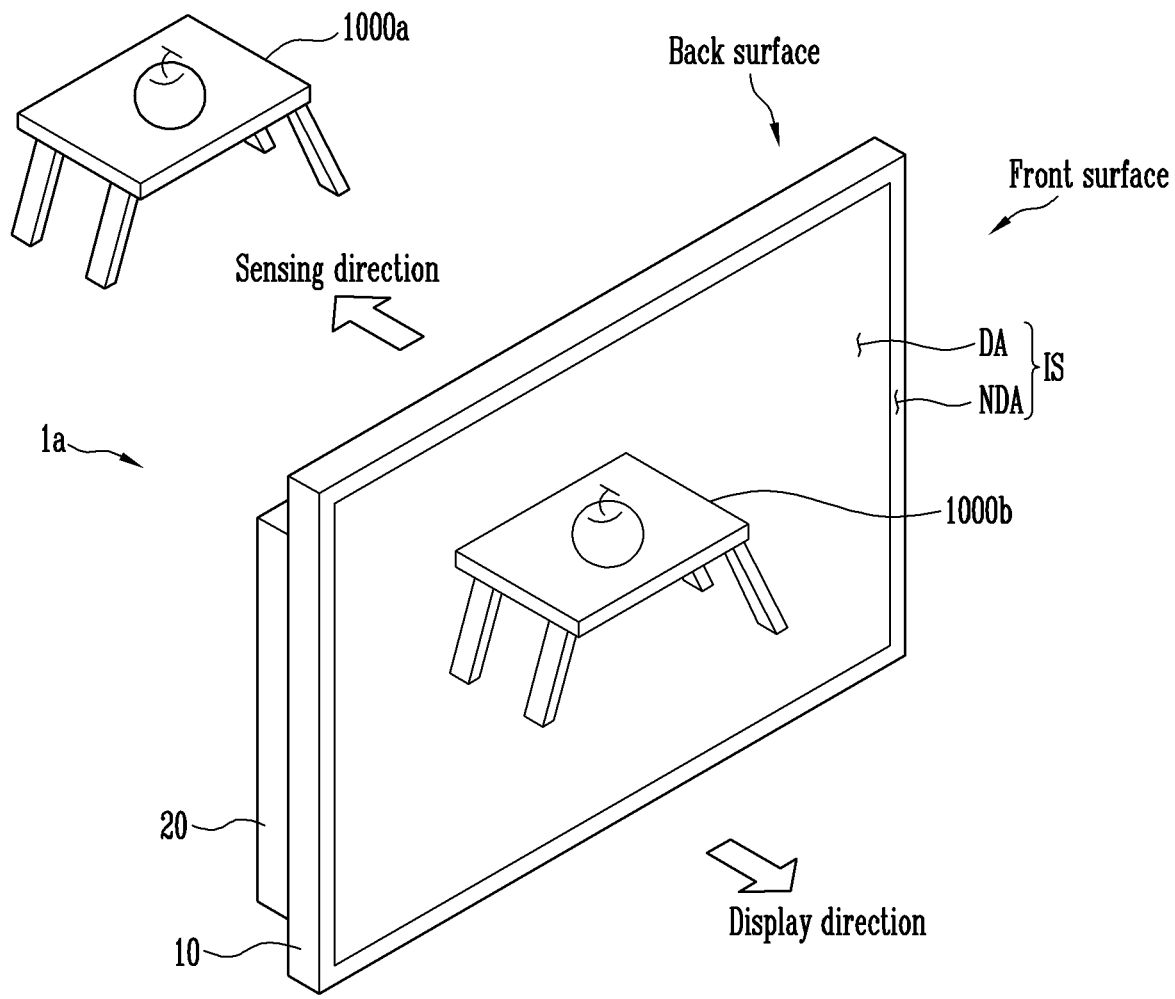
FIGS. 1 and 2 are schematic perspective views showing a front surface of a display device according to an embodiment.

Advantages, features, and implementation methods will be clarified through following embodiments described with reference to the accompanying drawings. The concepts of the disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Further, the scope of the disclosure is only defined by the claims, including any equivalents.

The same reference numerals designate the same elements throughout the specification and drawings. In the drawings, sizes and thicknesses of elements may be enlarged for clarity and ease of description thereof. However, the disclosure is not limited to the illustrated sizes and thicknesses. In the drawings, the thicknesses of layers, films, panels, regions, and other elements may be exaggerated for clarity.

The terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

It will be understood that when an element or a layer is referred to as being 'on' another element or layer, it can be directly on another element or layer, or an intervening element or layer may also be present.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the disclosure. When explaining the singular, unless explicitly described to the contrary, it may be interpreted as the plural meaning.

"About" or "approximately" as used herein is inclusive of the stated value and may mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

The phrase "at least one of" is intended to include the meaning of "at least one selected from the group of" for the purpose of its meaning and interpretation. For example, "at least one of A and B" may be understood to mean "A, B, or A and B."

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." When possible attributes are listed (e.g., "X may include A, B, and C", "X may be formed of A, B, or C", and the like), it is intended that individual attributes as well as possible combinations of attributes are included for purposes of meaning and interpretation.

Hereinafter, referring to the accompanying drawings, embodiments of the disclosure will be described in further detail.

Figure 2:
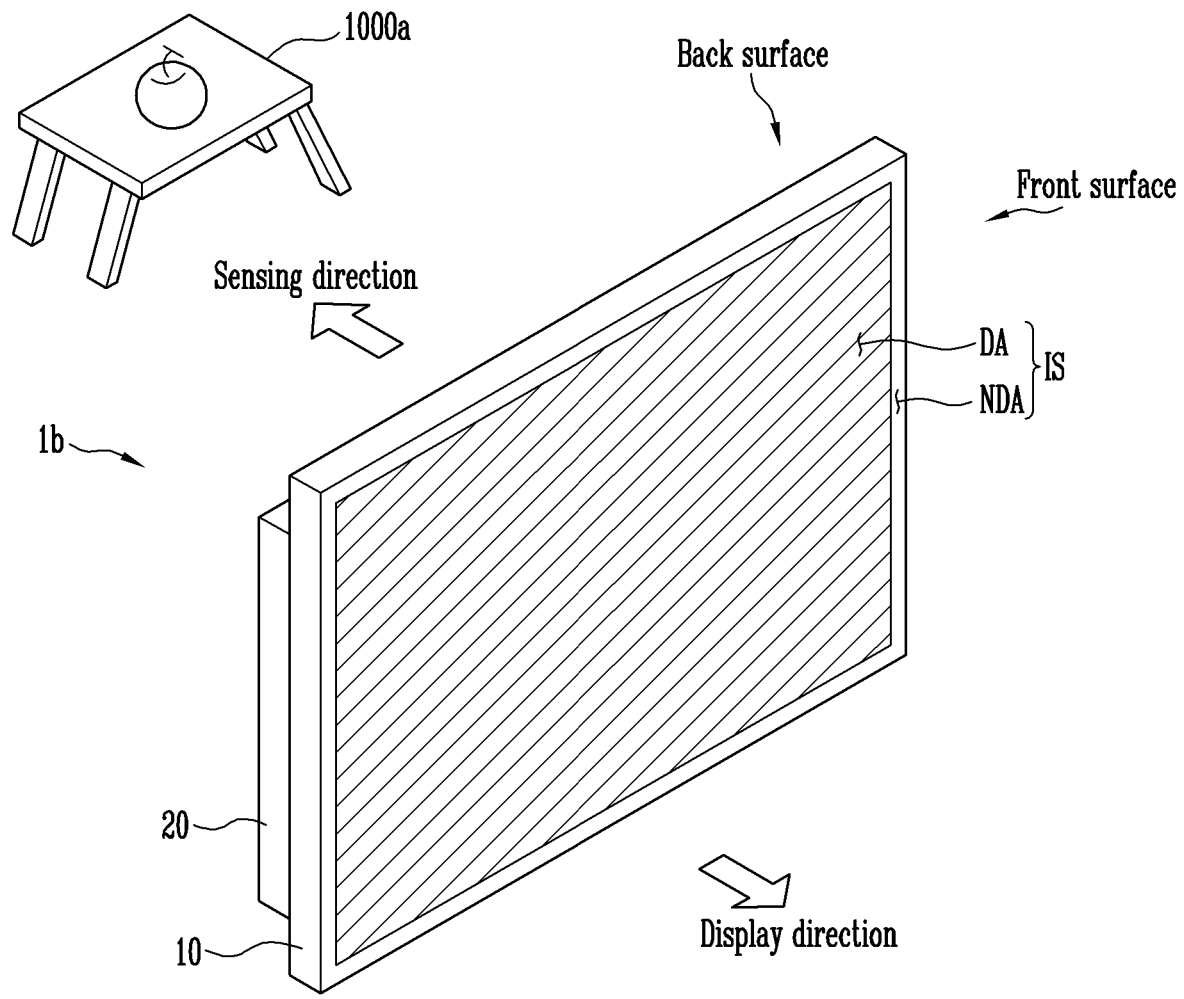
Figure 3:
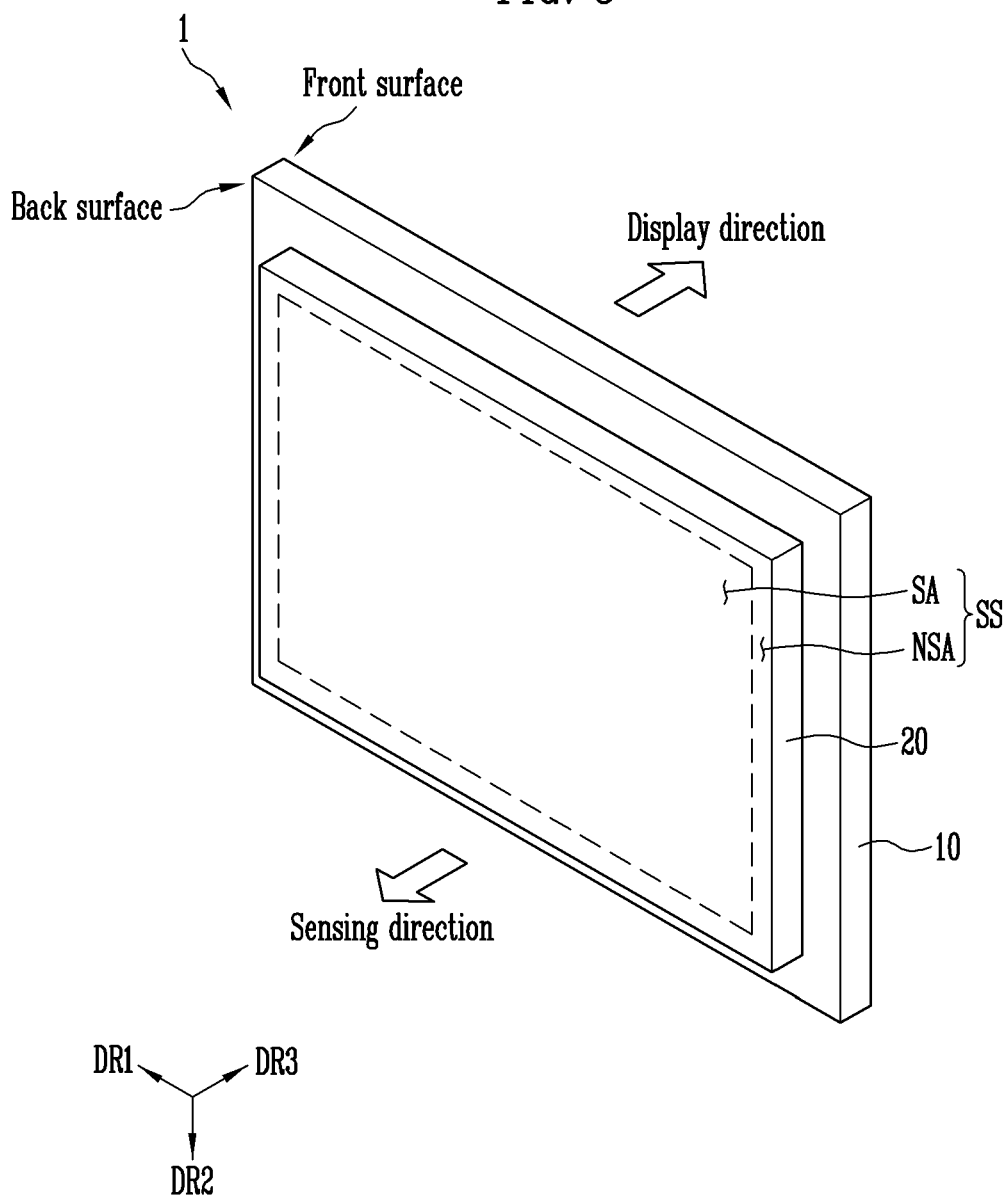
FIG. 3 is a schematic perspective view showing a back surface of a display device according to an embodiment.

FIGS. 1 and 2 are schematic perspective views showing a front surface of a display device according to an embodiment. FIG. 3 is a schematic perspective view showing a back surface of a display device according to an embodiment.

FIG. 1 is a schematic perspective view in case that an image sensor of the display device may be operated, and FIG. 2 is a schematic perspective view in case that the image sensor of the display device may not be operated. FIGS. 1 and 2 shows an object unrelated to the display device for better understanding and ease of description, and shows the object placed behind a back surface of the display device.

Referring to FIGS. 1 to 3, the display device 1a, 1b, 1 includes a display part 10 and a light receiver 20 disposed on a back surface of the display part 10.

The display device 1 may display an image through a display surface IS of the display part 10.

Hereinafter, a television will be described as an example of the display device 1. However, embodiments are not limited thereto. The display device 1 may be an electronic device having a display surface IS, for example, a smartphone, a tablet PC, a mobile phone, a video phone, an e-book reader, a desktop PC, a laptop PC, a netbook computer, a workstation, a server, a PDA, a portable multimedia player (PMP), an MP3 player, a medical equipment, a camera, a wearable, and the like.

A display direction may be defined in a normal direction of the display surface IS. In the drawing, the display surface IS is shown to be the front surface of the display part 10 and is shown to have a planar shape defined by a first direction DR1 and a second direction DR2 crossing the first direction DR1. The display direction is shown to be a third direction DR3. However, this may be exemplary and a display device 1 of another embodiment may be implemented such that the display surface IS has a curved shape, and in this case, the display direction may have various directions.

The third direction DR3 may indicate the normal direction of the display surface IS, for example, a thickness direction of the display part 10. A front surface (or top surface) and a back surface (or bottom surface) of each member may be separated by the third direction DR3. However, directions (e.g., first to third directions DR1, DR2, and DR3) are a relative concept and may be converted to other directions. Hereinafter, the first to third directions DR1, DR2, and DR3 are referred to consistently as indicated by the first to third direction indicators, DR1, DR2, and DR3, respectively.

In an embodiment, the display part 10 may be formed of a quantum dot organic light emitting display panel. However, the embodiments are not limited thereto, and the display part 10 may include a display panel such as an organic light emitting display panel, a liquid crystal display panel, a micro LED display panel, and a plasma display panel, an electrophoretic display panel, a micro electromechanical system display panel (MEMS), an electrowetting display panel, or the like.

In the display part 10, the display surface IS may include a display area DA displaying an image and a non-display area NDA adjacent to the display area DA. The display area DA may be defined by light emitting elements, and may include color areas (e.g., LA11, etc., see FIG. 6) that may be areas that emit light of a color.

A non-display area NDA may be an area in which an image may not be displayed. The display area DA may have a quadrangle shape. The non-display area NDA may be disposed to surround the display area DA in a plan view. However, the embodiments are not limited thereto, and a shape of the display area DA and a shape of the non-display area NDA may be relatively designed differently.

In an embodiment, the display device 1 may not include a physical opening through which a back side of the display device 1 may be transmitted in the display area DA. For example, the display device 1 may not include a hole passing from a front surface to a back surface thereof in the display area DA. However, the embodiments are not limited thereto.

The display device 1 may sense an image of an object 1000a disposed behind the display device 1 through a sensing surface SS of the light receiver 20. For example, the light receiver 20 may sense the object 1000a disposed in a sensing direction of the sensing surface SS and selectively display the object 1000a on the display surface IS as image 1000b. In an embodiment, the sensing surface SS may face another direction such as the display surface IS.

The sensing surface SS may include a sensing area SA that may be an area for sensing an image of the object 1000a and a non-sensing area NSA adjacent to the sensing area SA. The sensing area SA may be defined by image sensing elements, and may include absorption areas (e.g., SA11, etc., see FIG. 9), which may be areas for absorbing and sensing light of a color. In an embodiment, the image sensing element may be a photoelectric conversion element to be described later. For example, the photoelectric conversion element may be implemented in a form of photodiode.

The non-sensing area NSA may be an area in which the image sensing elements may not be disposed. The sensing area SA may have a quadrangle shape. The non-sensing area NSA may be disposed to surround the sensing area SA in a plan view. However, the embodiments are not limited thereto, and the shape of the sensing area SA and the shape of the non-sensing area NSA may be relatively designed differently.

The light receiver 20 may sense an image viewed by the back surface of the display device 1 and output the image to the display part 10. For example, the display device 1 may sense the object 1000a disposed in the sensing direction opposite to the display direction to selectively output the same to the display surface IS as object 1000b.

In an embodiment, a planar area of the light receiver 20 may be equal to or smaller than a planar area of the display part 10. For example, the light receiver 20 may overlap at least some areas of the back surface of the display part 10. In this specification, "overlapping" may mean that two configurations overlap in the thickness direction (i.e., third direction DR3 in the drawing) of the display device 1 unless otherwise defined. An area of the sensing area SA may be equal to or less than an area of the display area DA.

The display device 1 may include image sensing elements in an operational state (represented in FIG. 1 by display device 1a) or a non-operational state (represented in FIG. 2 by display device 1b). In case that the image sensing elements may be in the operating state 1a, the display device 1 may sense and image the object 1000a disposed in the sensing direction, and display it on the display part 10 as object 1000b. For example, the image may be provided so that the user may see behind the back surface of the display device 1.

In case that the image sensing elements may be in the non-operational state 1b, the display device 1 may not output on the display part the object 1000a which may be disposed in the sensing direction. For example, the user may not see behind the display device 1.

Hereinafter, referring to FIGS. 4 to 12, the display device 1 will be described in more detail. First, referring to FIGS. 4 to 9, a driving method of the display device 1 will be described.

Figure 4:
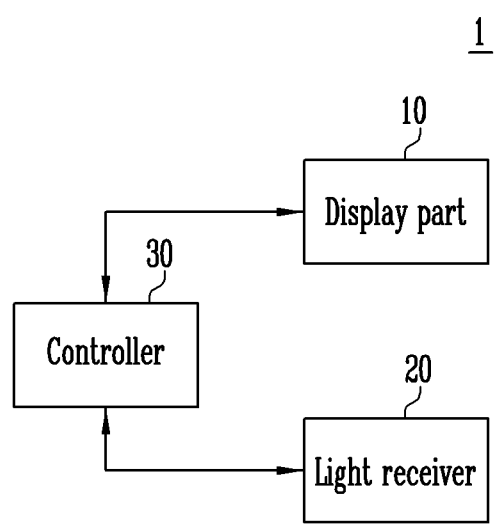
FIG. 4 is a block diagram schematically showing a display device according to an embodiment.
Figure 5:
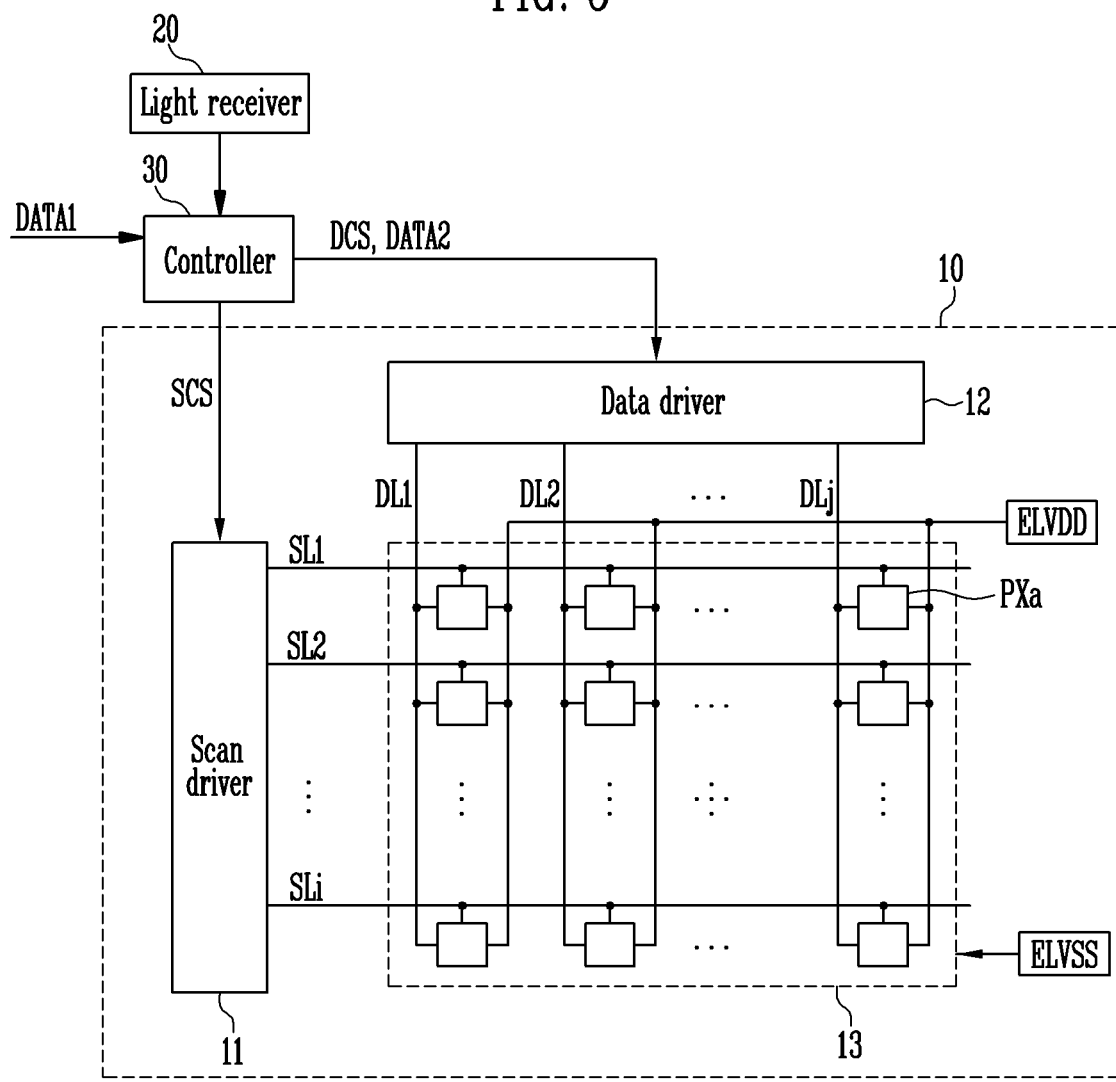
FIG. 5 is a block diagram schematically showing a display part of a display device according to an embodiment.
Figure 6:
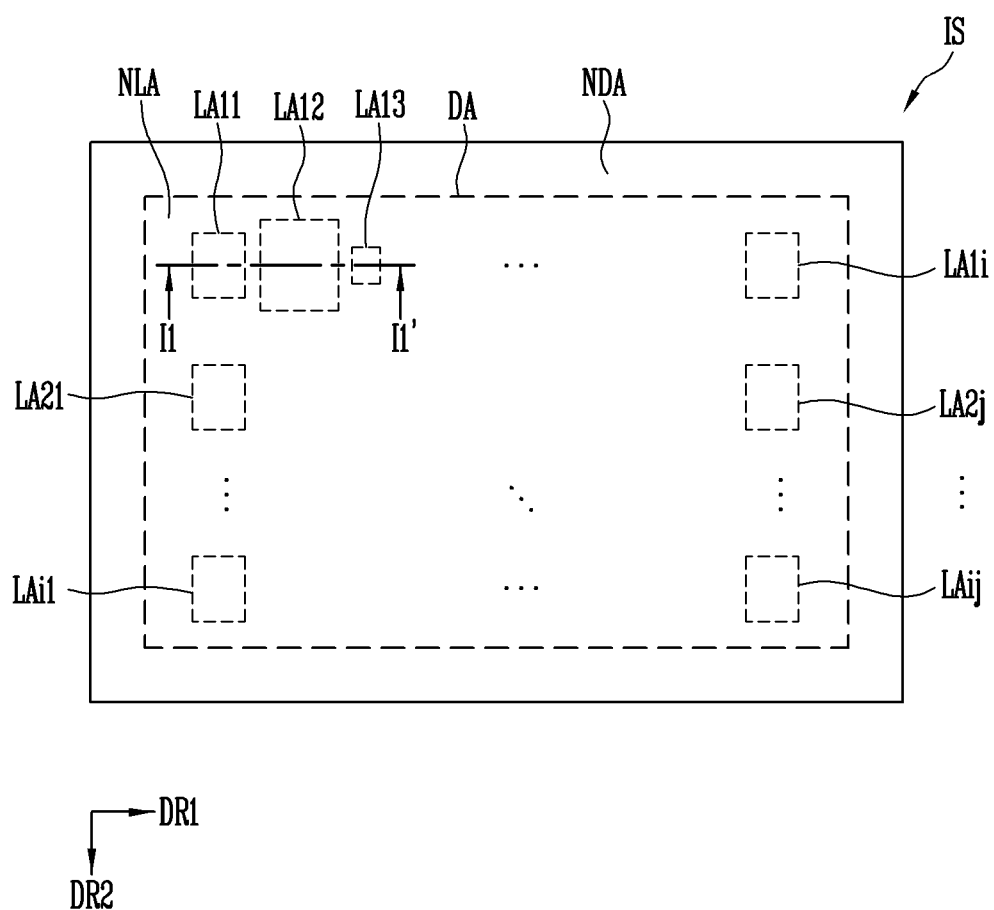
FIG. 6 is a schematic top plan view showing a display surface of a display device according to an embodiment.
Figure 7:
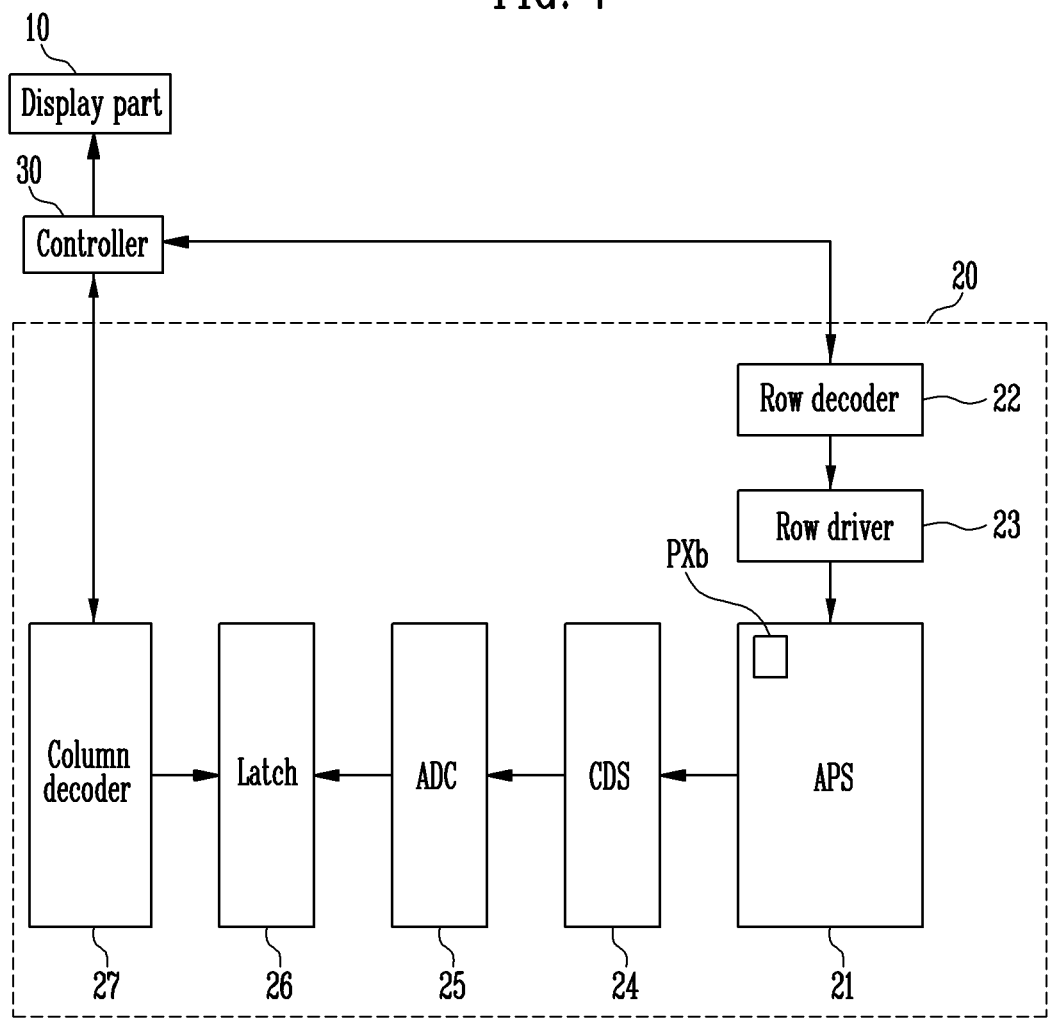
FIG. 7 is a block diagram schematically showing a light receiver of a display device according to an embodiment.
Figure 8:
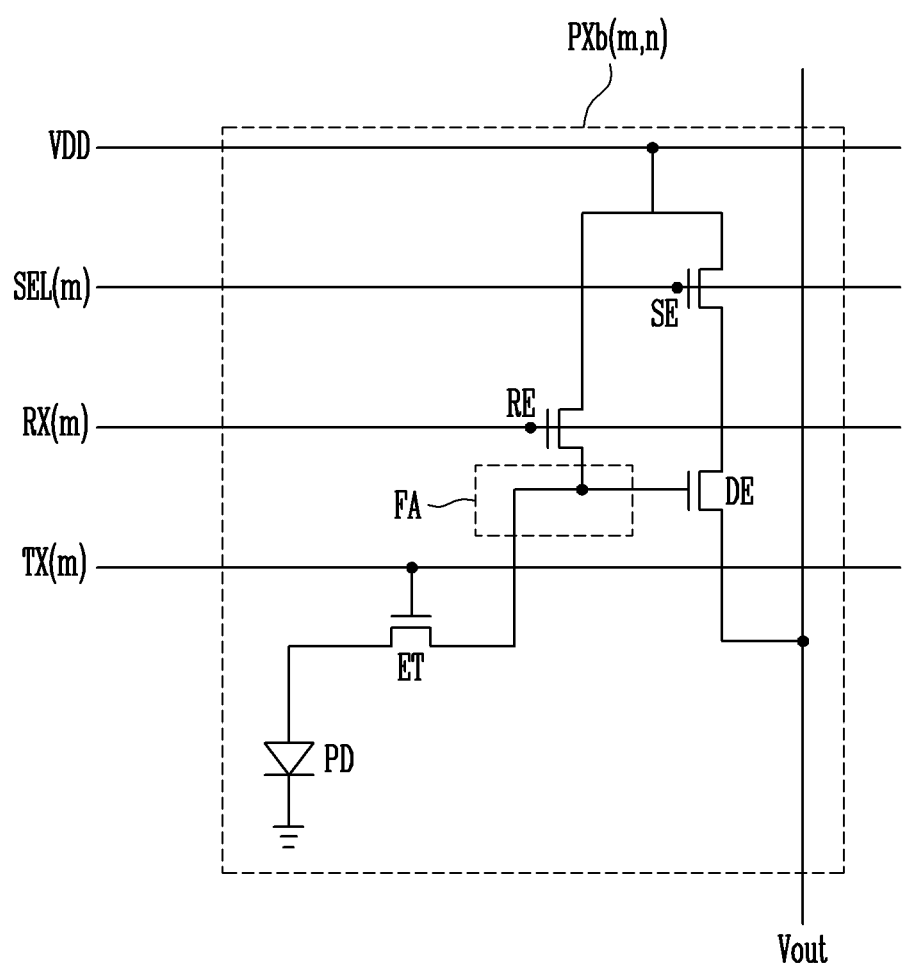
FIG. 8 is an equivalent circuit diagram of a sensing pixel of FIG. 7.
Figure 9:
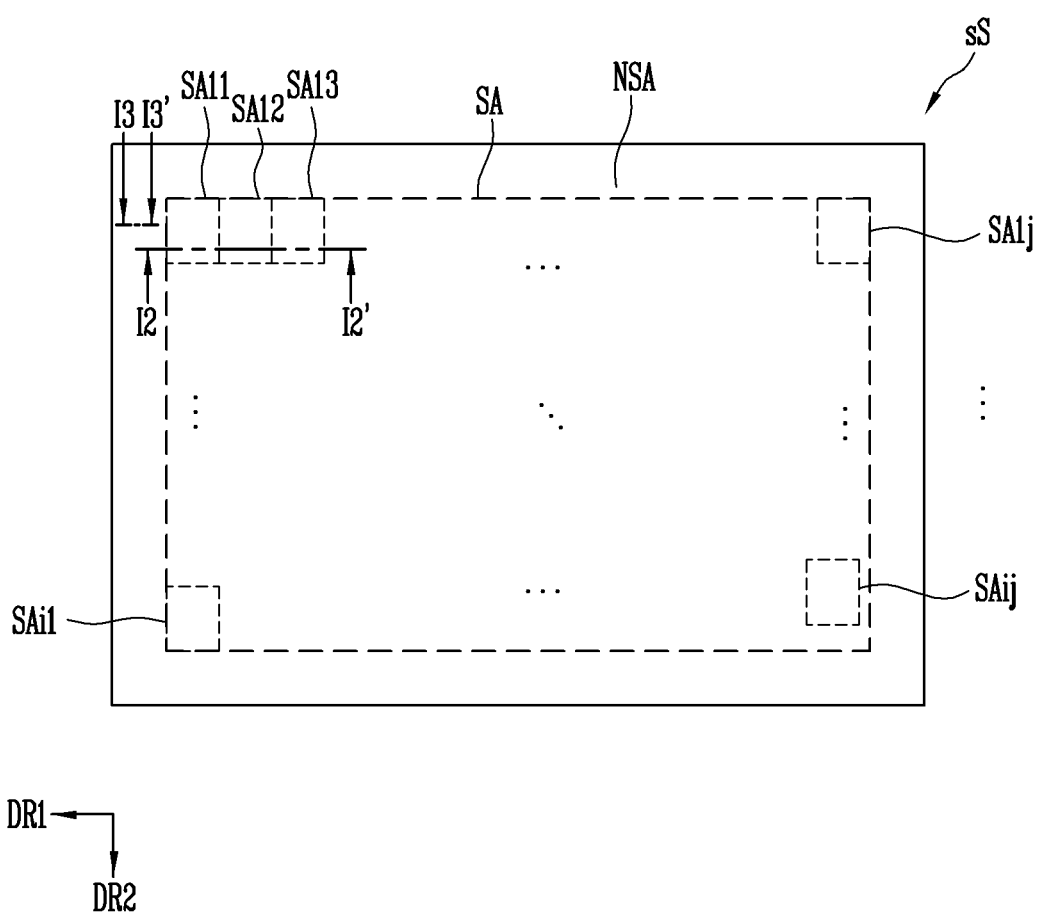
FIG. 9 is a schematic top plan view showing a sensing surface of a display device according to an embodiment.

FIG. 4 is a block diagram schematically showing a display device according to an embodiment. FIG. 5 is a block diagram schematically showing a display part of a display device according to an embodiment. FIG. 6 is a schematic top plan view showing a display surface of a display device according to an embodiment. FIG. 7 is a block diagram schematically showing a light receiver of a display device according to an embodiment. FIG. 8 is an equivalent circuit diagram of one sensing pixel of FIG. 7. FIG. 9 is a schematic top plan view showing a sensing surface of a display device according to an embodiment.

Referring to FIGS. 4 to 9, the display device 1 according to an embodiment of the invention may include a display part 10, a light receiver 20 and a controller 30. The controller 30 may control the display part 10 and the light receiver 20, respectively. In detail, the controller 30 may control a display pixel PXa of the display part 10 and a sensing pixel PXb of the light receiver 20.

In an embodiment, the controller 30 may include hardware and/or software for performing functions of an image processor, a timing controller, and the like. The image processor may perform color processing on image data decoded from the sensing pixels PXb (m, n) of m rows and n columns of the light receiver 20 to perform at least one of an image conversion and an image quality improvement. The timing controller may convert (or modulate) input data to be available in the data driver 12 and control the scan driver 11 and the data driver 12 in the display part 10. The timing controller may provide a timing signal and a control signal to a row decoder 22 and a column decoder 27 of the light receiver 20.

The display part 10 may include a pixel portion 13 including display pixels PXa disposed in an area partitioned by scan lines SL1 to SLi (i may be 2 or more in natural numbers) and data lines DL1 to DLj (j may be 2 or more in natural numbers), a scan driver 11 for supplying (e.g., sequentially supply) a scan signal to scan lines SL1 to SLi, and a data driver 12 for supplying a data signal to data lines DL1 to DLj whenever the scan signal may be supplied.

The pixel portion 13 may receive a first power supply ELVDD and a second power supply ELVSS as a power supply for the display pixel PXa. Therefore, each of the display pixels PXa that may receive the first power supply ELVDD and the second power supply ELVSS may receive the data signal in case that the scan signal may be supplied, and may generate light of a luminance corresponding to the supplied data signal.

Although not explicitly shown, in an embodiment, the pixel portion 13 may include a first display pixel, a second display pixel, and a third display pixel that emit red, green, and blue light, respectively. The first display pixel, the second display pixel, and the third display pixel may define a color area that emits red, green, and blue light, respectively.

The display area DA may include a light emitting area and a non-light emitting area NLA. The light emitting area may be defined as an area in which light may be transmitted to be visible to the user in the display area DA. The light emitting area may include color areas LA11 to LAij. The color areas LA11 to LAij may be arranged in a matrix form. For example, the color areas LA11 to LAij may be arranged in the form of an i*j matrix. Hereinafter, as an example, embodiments will be described with respect to a first color area LA11 that may be a color area of a first row and a first column, a second color area LA12 that may be a color area of a first row and a second column, and a third color area LA13 that may be a color area of a first row and a third column.

However, some embodiments may further include an area that emits white light. In another embodiment, the color areas include areas that emit cyan, magenta, and yellow light instead of an area that emits red light, an area that emits green light, and an area that emits blue light. Hereinafter, a case where the light emitting area of the display device 1 includes the first color area LA11, the second color area LA12, and the third color area LA13 that respectively emit red, green, and blue light will be described as an example. However, a type of color and a disposition order of the first color area LA11, the second color area LA12 and the third color area LA13 are not limiting of the embodiments.

In an embodiment, each color area LA11 to LAij may include one display pixel PXa. For example, the display part 10 may include a red display pixel PXa in the first color area LA11, a green display pixel PXa in the second color area LA12, and a blue display pixel PXa in the third color area LA13.

In this specification, blue light corresponds to light having a wavelength range of about 450 nm to about 495 nm, green light corresponds to light having a wavelength range of about 495 nm to about 570 nm, and red light corresponds to light having a wavelength range of about 620 nm to about 750 nm.

The first color area LA11, the second color area LA12 and the third color area LA13 may be alternately arranged in the column direction and/or row direction.

In this specification, the column direction may mean a vertical direction in the drawing as the second direction DR2. The row direction may mean a horizontal direction in the drawing as the first direction DR1. For example, the column direction may be a direction crossing the row direction.

In an embodiment, each color areas LA11 to LAij may have a quadrangle shape. In an embodiment, sizes of the color areas LA11 to LAij may be different from each other. A size of the third color area LA13 may be greater than a size of the first color area LA11, and the size of the first color area LA11 may be greater than a size of the second color area LA12. However, a shape and a size order of each color area LA11 to LAij are not limiting of the embodiments.

The non-light emitting area NLA may be defined as an area for distinguishing color areas LA11 to LAij in the display area DA. For example, the non-light emitting area NLA may be an area that does not emit light. The non-light emitting area NLA may have a shape surrounding the color areas LA11 to LAij.

The sensing surface SS may include absorption areas SA11 to SAij and a non-sensing area NSA. The absorption areas SA11 to SAij may be defined by sensing pixels PXb to be described later. One sensing pixel PXb may be provided in each of the absorption areas SA11 to SAij.

The absorption areas SA11 to SAij may be arranged in a form of an i*j matrix. In an embodiment, sizes of the absorption areas SA11 to SAij may be substantially the same each other. The sizes of the absorption areas SA11 to SAij may be less than or equal to sizes of the color areas LA 11 to LAij. However, the embodiments of the absorption areas SA11 to SAij are not limited thereto. In another embodiment, the area of the absorption areas SA11 to SAij may change according to a color being sensed.

The non-sensing area NSA may be defined as an area in which the sensing pixels PXb may not be disposed. The non-sensing area NSA may surround the absorption areas (SA11 to SAij).

The light receiver 20 may include an active sensing pixel (APS) array 21 in which the sensing pixels PXb including a photoelectric conversion element may be arranged in two dimensions, a row decoder 22, a row driver 23, a correlated double sampler (CDS) 24, an analog to digital converter (ADC) 25, a latch 26, a column decoder 27, and the like.

The APS array 21 may include sensing pixels PXb arranged in two dimensions. In an embodiment, the sensing pixels PXb may be arranged in the form of i*j matrix corresponding to an arrangement of the absorption areas SA11 to SAij.

The sensing pixels PXb may convert an optical image into an electrical output signal. The APS array 21 may be driven by receiving driving signals, such as a row selection signal, a reset signal, a charge transfer signal, and the like from the row driver 23. The converted electrical output signal may be provided to the correlated double sampler 24 through the vertical signal line.

The row driver 23 may provide driving signals for driving sensing pixels PXb to the APS array 21 according to a result decoded by the row decoder 22. In general, in case that the sensing pixels PXb may be arranged in a matrix form, a driving signal may be provided for each row.

The correlated double sampler 24 may receive an output signal formed in the APS array 21 through a vertical signal line to hold and sample the same. For example, the correlated double sampler 24 may twice sample a specific noise level and a signal level by the output signal, to output a difference level corresponding to a difference between the noise level and the signal level.

The analog digital converter 25 may convert an analog signal corresponding to the difference level into a digital signal and output the digital signal.

The latch 26 may latch the digital signal, and the latched signal may be sequentially output to a video signal processor (not shown) according to the decoded result from the column decoder 27.

Each sensing pixel PXb may include a photoelectric conversion element PD, a floating diffusion area FA, a charge transfer element ET, a drive element DE, a reset element RE, and a selection element SE. These functions will be described by using m row and n column of sensing pixels PXb (m, n) as an example.

The photoelectric conversion element PD may absorb incident light to accumulate charge corresponding to an amount of light. For example, a photo diode, a photo transistor, a photo gate, or a combination thereof may be applied to the photoelectric conversion element PD, and an embodiment of the invention illustrates a pinned photodiode as a photo diode.

Each photoelectric conversion element PD may be coupled with each charge transfer element ET which may transfer the accumulated charge to a floating diffusion area FA. Since the floating diffusion area FA may be an area that converts a charge into a voltage and may have a parasitic capacitance, a charge may be stored cumulatively.

The drive element DE, which may be illustrated as a source follower amplifier, may amplify a change in an electrical potential of the floating diffusion area FA that that may receive the charge accumulated in each photoelectric conversion element PD and may output the same to an output line Vout.

The reset element RE may reset (e.g., periodically reset) the floating diffusion area FA. The reset element RE may be formed of one MOS transistor driven by a bias provided by a reset line RX (m) applying a bias. In case that the reset element RE may be turned on by the bias provided by the reset line RX (m), the electrical potential provided to a drain of the reset element RE, for example a power voltage VDD, may be transferred to the floating diffusion area FA.

The selection element SE may play a role of selecting the sensing pixel PXb (m, n) to be read in a row unit. The selection element SE may be formed of one MOS transistor driven by a bias provided by a row selection line SEL (m). In case that the selection element SE may be turned on by the bias provided by the row selection line SEL (m), the electrical potential provided to a drain of the selection element SE, for example a power voltage VDD, may be transferred to a drain region of the drive element DE.

A transfer line TX (m) that may apply a bias to the charge transfer element ET, a reset line RX (m) that may apply a bias to the reset element RE, and a row selection line SEL (m) that may apply a bias to the select element SE may be arranged to extend parallel (e.g., substantially parallel) to each other in the row direction.

In an embodiment, a number of the sensing pixels PXb and a number of the display pixels PXa may be substantially the same or identical. For example, a matrix formed by the sensing pixels PXb may be in a form of an i*j matrix corresponding to a form of an i*j matrix formed by the display pixels PXa. The sensing pixels PXb may be matched one-to-one with the display pixels PXa. For example, an image color collected by sensing pixels PXb of m rows and n columns may be emitted through display pixels PXa of m rows and n columns. An image color collected by one of the sensing pixels emits light through a corresponding one of the display pixels.

By forming the display device 1 such that a number of the sensing pixels PXb and a number of display pixels PXa may be matched, the display device 1 may provide an image at a magnification with respect to a background viewed by a back surface of the display device 1.

A structure of the display device 1 will be described with reference to FIGS. 10 to 16.

Figure 10:
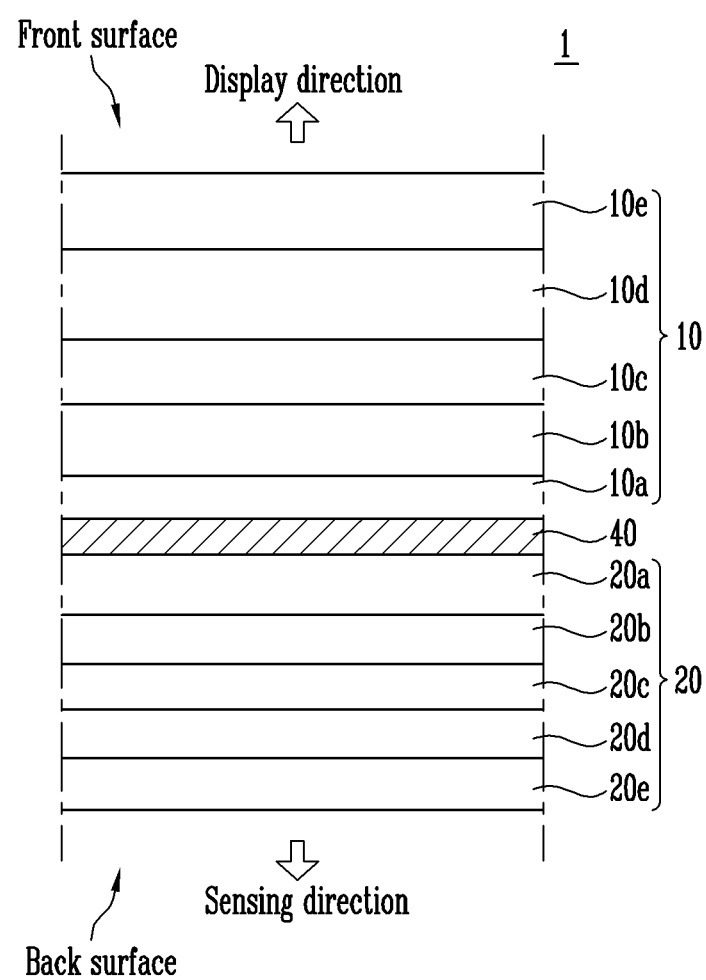
FIG. 10 is a schematic cross-sectional view of a display device according to an embodiment.
Figure 11:
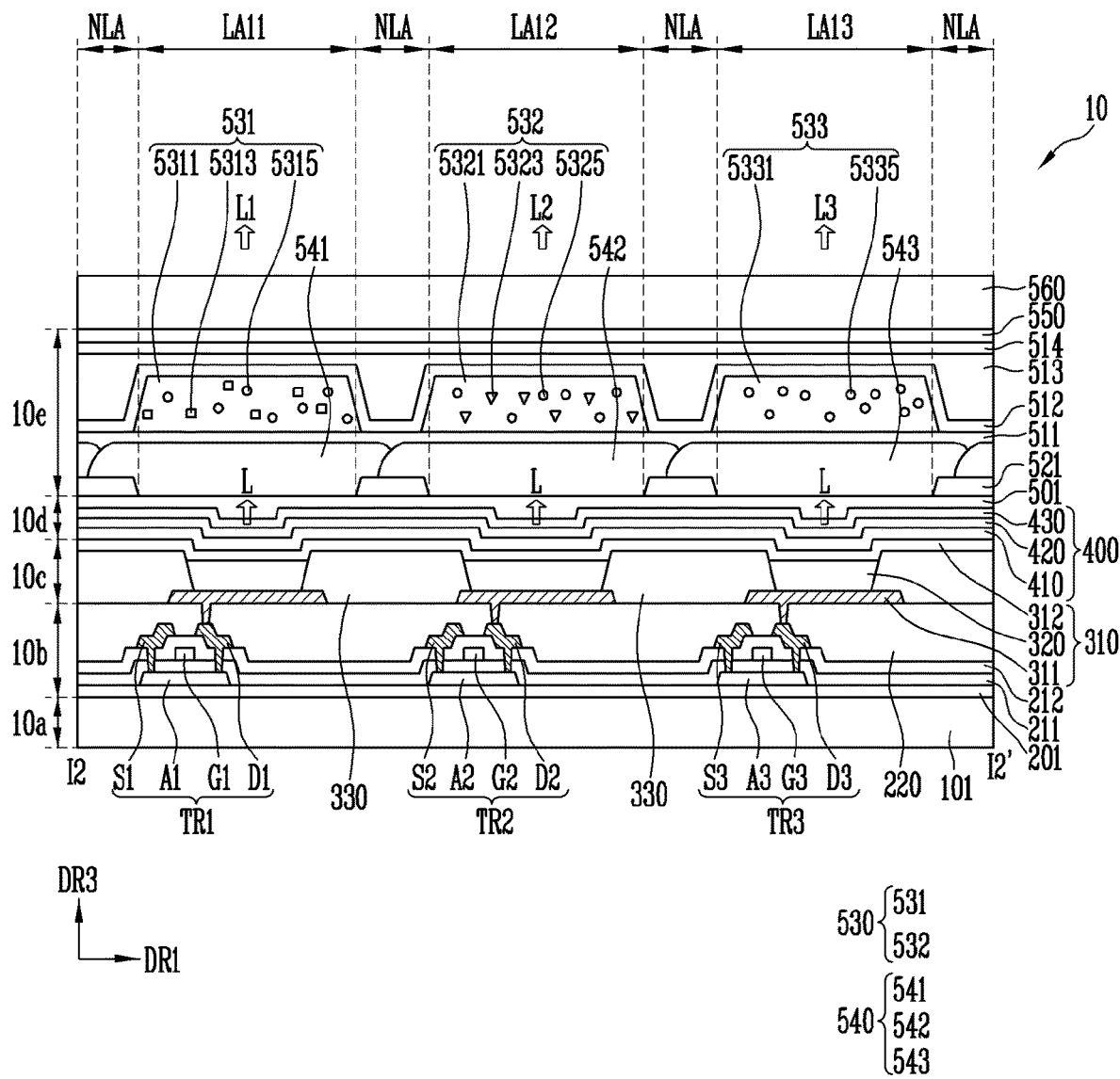
FIG. 11 is a schematic cross-sectional view of a display part taken along line 11-11' of FIG. 6.
Figure 12:
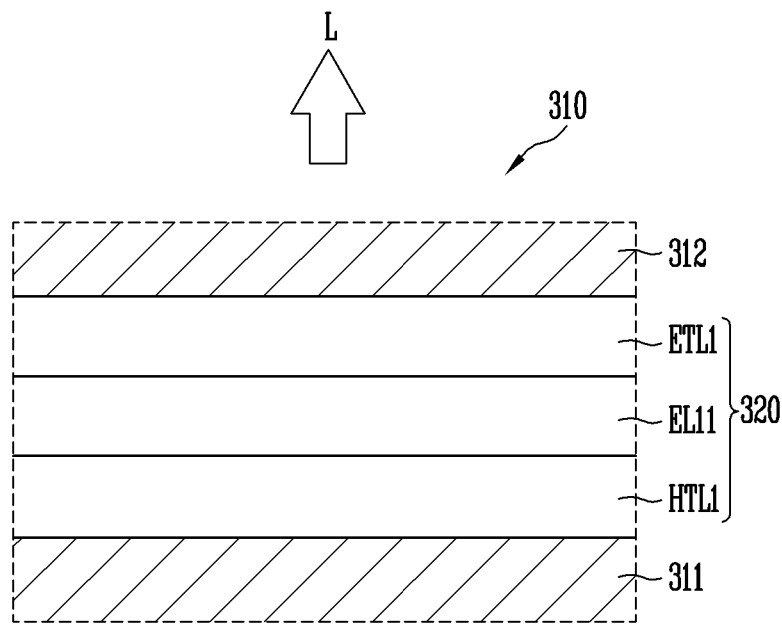
FIG. 12 is a schematic cross-sectional view of an organic light emitting diode of FIG. 11.
Figure 13:
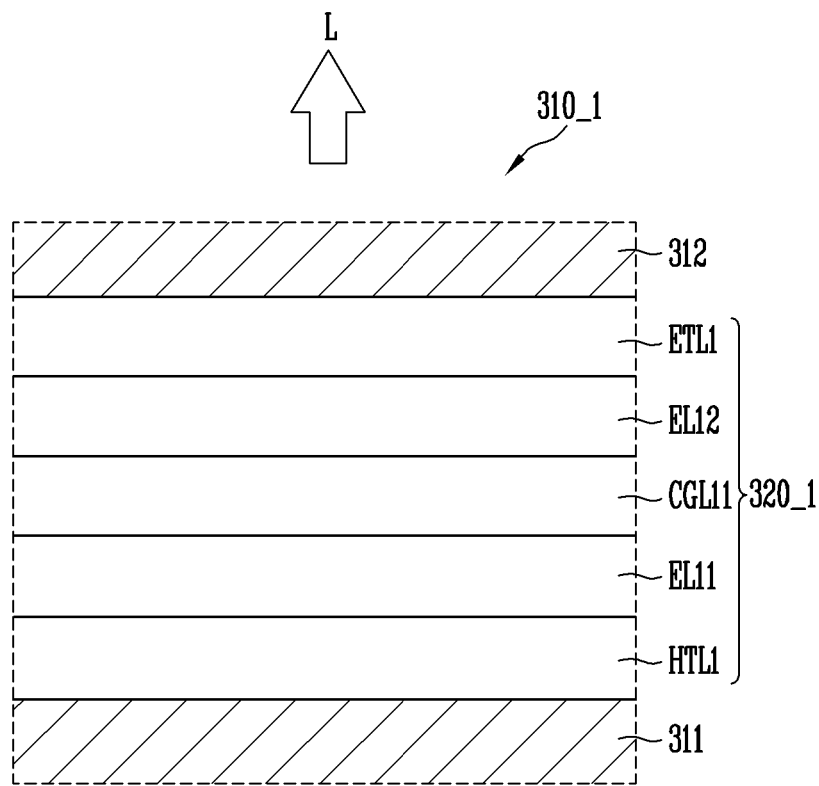
FIG. 13 is a schematic cross-sectional view showing a modified example of an organic light emitting diode shown in FIG. 11.
Figure 14:
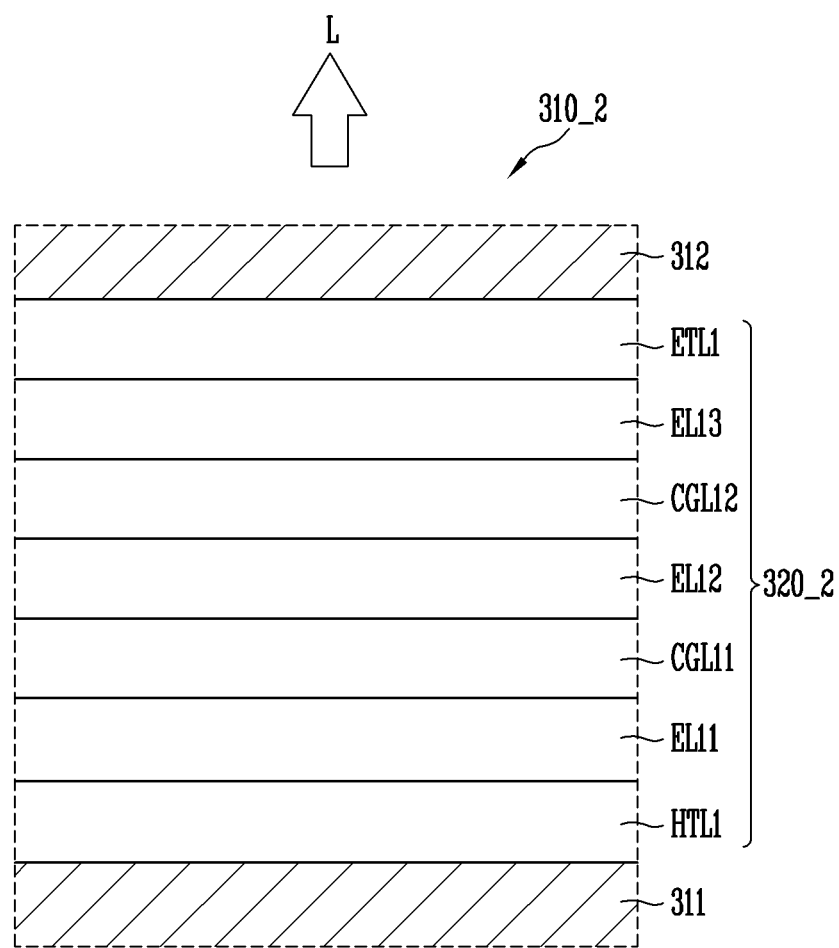
FIG. 14 is a schematic cross-sectional view showing another modified example of an organic light emitting diode shown in FIG. 11.
Figure 15:
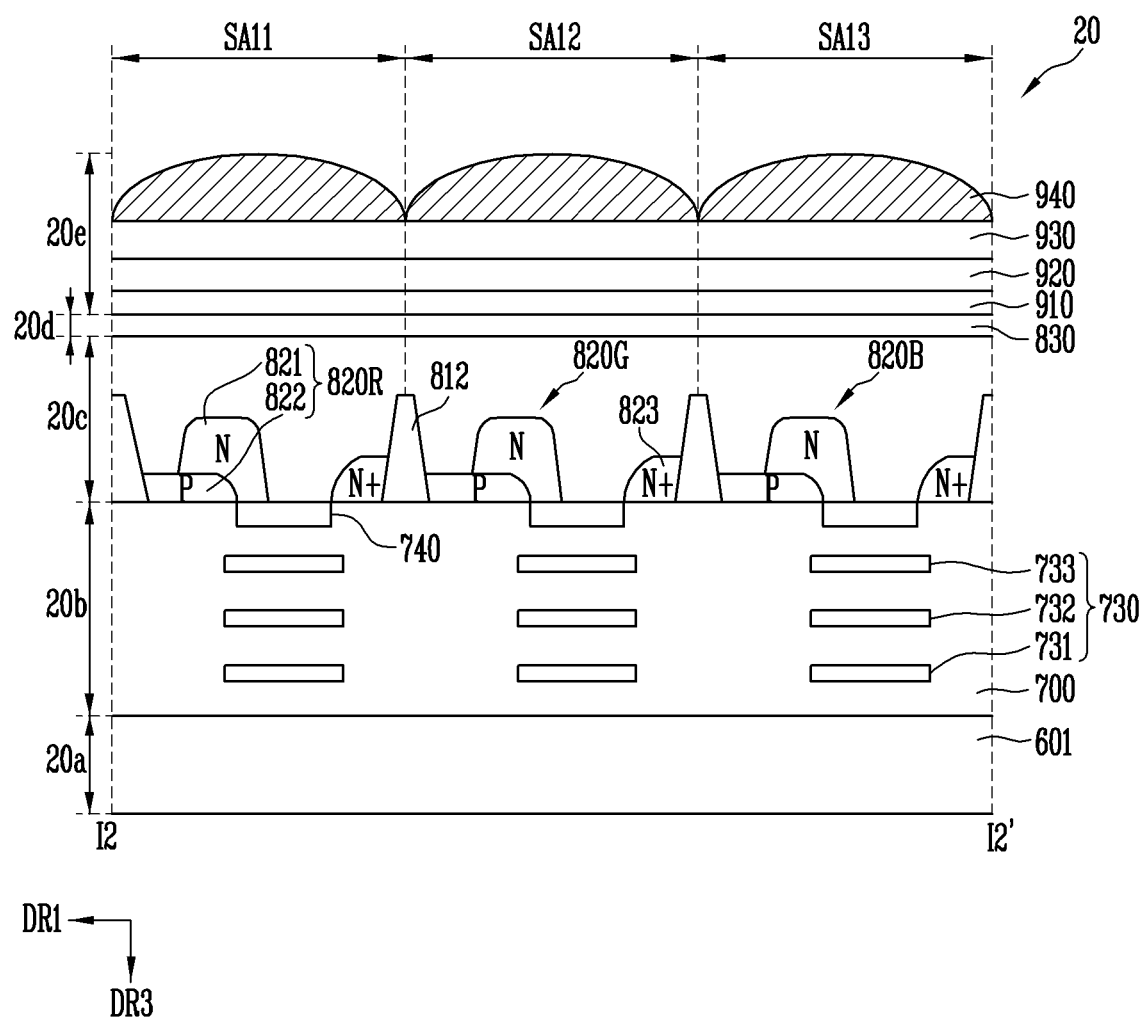
FIG. 15 is a schematic cross-sectional view of a light receiver taken along line 12-12' of FIG. 9.
Figure 16:
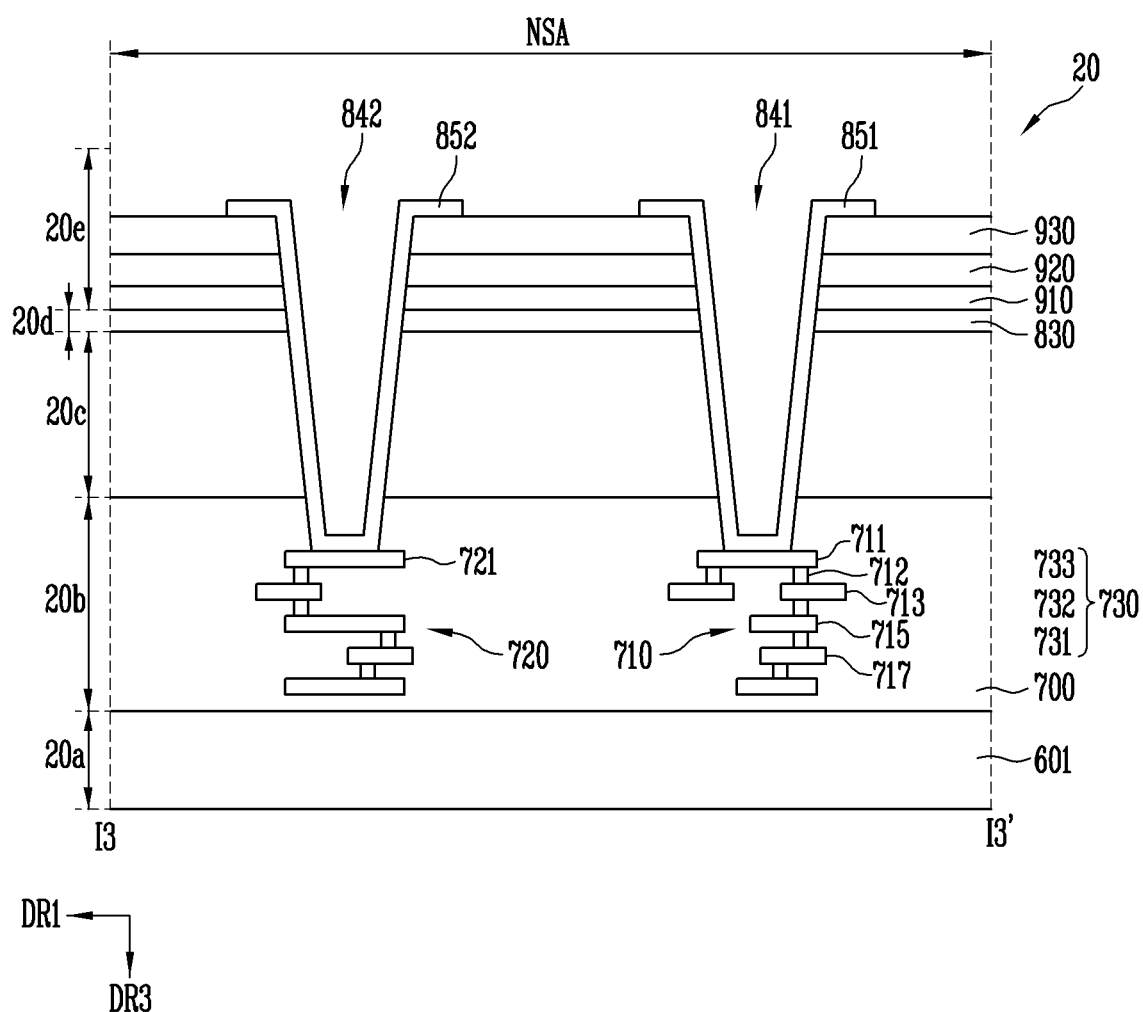
FIG. 16 is a schematic cross-sectional view of a light receiver taken along line 13-13' of FIG. 9.

FIG. 10 is a schematic cross-sectional view of a display device according to an embodiment. FIG. 11 is a schematic cross-sectional view of a display part taken along line 11-11' of FIG. 6. FIG. 12 is a schematic cross-sectional view of an organic light emitting diode of FIG. 11. FIG. 13 is a schematic cross-sectional view showing a modified example of an organic light emitting diode shown in FIG. 11. FIG. 14 is a schematic cross-sectional view showing another modified example of an organic light emitting diode shown in FIG. 11. FIG. 15 is a schematic cross-sectional view of a light receiver taken along line 12-12' of FIG. 9. FIG. 16 is a schematic cross-sectional view of a light receiver taken along line 13-13' of FIG. 9.

Referring to FIG. 10, a display substrate 10a of the display part 10 and a sensing substrate 20a of the light receiver 20 may be disposed to face each other with an adhesive layer 40 interposed therebetween.

The display part 10 may include a display substrate 10a, and may include a first circuit layer 10b, a light emitting element layer 10c, a first encapsulation layer 10d, and a color conversion element layer 10e disposed (e.g., sequentially disposed) on a surface of the display substrate 10a with respect to the display direction.

The light receiver 20 may include a sensing substrate 20a, and may include a second circuit layer 20b, a sensing element layer 20c, a second encapsulation layer 20d, and a photorefractive layer 20e disposed (e.g., sequentially disposed) on a surface of the sensing substrate 20a with respect to the sensing direction.

The adhesive layer 40 may attach another (or the other) surface of the display substrate 10a and another (or the other) surface of the sensing substrate 20a that may face each other. In an embodiment, the adhesive layer 40 may be a silicone-based adhesive. The adhesive layer 40 may be formed of an opaque material. However, according to an embodiment, the adhesive layer 40 of a transparent material may be used.

In the specification, a surface (or one surface) and another surface (or the other surface) refer to a relative surface facing each other, and are not limiting to the embodiments.

First, referring to FIG. 11, the structure (e.g., stacked structure) of the display part 10 will be described.

The display part 10 may include a display substrate 101, switches TR1, TR2, and TR3 disposed on the display substrate 101, organic light emitting diodes 310 disposed on the switches TR1, TR2, and TR3, and a first encapsulation layer 400 disposed on the organic light emitting diodes 310.

The display substrate 101 may be a rigid substrate or a flexible substrate. Herein, in case that the display substrate 101 may be the rigid substrate, the display substrate 101 may be one of a glass substrate, a quartz substrate, a glass ceramic substrate, and a crystalline glass substrate. In case that the display substrate 101 may be the flexible substrate, the display substrate 101 may be one of a film substrate including a polymer organic material and a plastic substrate. The display substrate 101 may include fiber glass reinforced plastic (FRP). The display substrate 101 may be a lower substrate of the display part 10. In an embodiment, the display substrate 101 may be an opaque substrate.

A first buffer layer 201 may be disposed on the display substrate 101. The first buffer layer 201 may smooth a surface of the display substrate 101 and prevent penetration of moisture or outside air. The first buffer layer 201 may be an inorganic layer. The first buffer layer 201 may be a single layer or multiple layer.

The switches TR1, TR2, and TR3 may be disposed on the first buffer layer 201. Here, each of the switches TR1, TR2, and TR3 may be a thin film transistor. Each of the switches TR1, TR2, and TR3 shown in the drawing may be a driving transistor among thin film transistors.

The switches TR1, TR2, and TR3 may include a first switch TR1, a second switch TR2, and a third switch TR3. One or more of the switches TR1, TR2, and TR3 may be provided in each of the color areas LA11, LA12, and LA13. For example, the first switch TR1 may be provided in the first color area LA11, the second switch TR2 may be provided in the second color area LA12, and the third switch TR3 may be provided in the third color area LA13.

The switches TR1, TR2, and TR3 may include semiconductor layers A1, A2, and A3, gate electrodes G1, G2, and G3, source electrodes S1, S2, and S3, and drain electrodes D1, D2, and D3, respectively. Specifically, the semiconductor layers A1, A2, and A3 may be disposed on the first buffer layer 201. The semiconductor layers A1, A2, and A3 may include amorphous silicon, polysilicon, low temperature polysilicon, and an organic semiconductor. In another embodiment, the semiconductor layers A1, A2, and A3 may include an oxide semiconductor. Although not explicitly shown, the semiconductor layers A1, A2, and A3 may include a channel region, and a source region and a drain region disposed on opposite sides of the channel region and doped with an impurity.

A gate insulation layer 211 may be disposed on the semiconductor layers A1, A2, and A3. The gate insulation layer 211 may be an inorganic layer. The gate insulation layer 211 may be a single layer or multiple layer.

The gate electrodes G1, G2, and G3 may be disposed on the gate insulation layer 211. The gate electrodes G1, G2, and G3 may be formed of a metallic material having conductivity. For example, the gate electrodes G1, G2, and G3 may include molybdenum (Mo), aluminum (Al), copper (Cu), and titanium (Ti). The gate electrodes G1, G2, and G3 may be a single layer or multiple layer.

An interlayer insulation layer 212 may be disposed on the gate electrodes G1, G2, and G3. The interlayer insulation layer 212 may be an inorganic layer. The interlayer insulation layer 212 may be a single layer or multiple layer.

The source electrodes S1, S2, and S3, and the drain electrodes D1, D2, and D3 may be disposed on the interlayer insulation layer 212. The source electrodes S1, S2, and S3 and the drain electrodes D1, D2, and D3 may be formed of a metallic material with conductivity. For example, the source electrodes S1, S2, and S3 and the drain electrodes D1, D2, and D3 may include aluminum (Al), copper (Cu), titanium (Ti), and molybdenum (Mo).

The source electrodes S1, S2, and S3 and the drain electrodes D1, D2, and D3 may be electrically connected to the source region and the drain region of the semiconductor layers A1, A2, and A3 through a contact hole passing through the interlayer insulation layer 212 and the gate insulation layer 211, respectively.

Although not shown separately, the display device 1 may further include a storage capacitor and a switch transistor on the display substrate 101.

A protective layer 220 may be disposed on the source electrodes S1, S2, and S3, the drain electrodes D1, D2, and D3 and the interlayer insulation layer 212. Here, the protective layer 220 may be disposed to cover a circuit including the switches TR1, TR2, and TR3. The protective layer 220 may be a passivation layer or a planarization layer. The passivation layer may include SiO2, SiNx, and the like, and the planarization layer may include a material such as acryl or polyimide. The protective layer 220 may include both a passivation layer and a planarization layer. The passivation layer may be disposed on the source electrodes S1, S2, and S3, the drain electrodes D1, D2, and D3 and the interlayer insulation layer 212, and the planarization layer may be disposed on the passivation layer. An upper surface of the protective layer 220 may be flat.

The first buffer layer 201 to the protective layer 220 may correspond to the first circuit layer 10b of FIG. 10.

Organic light emitting diodes 310 may be disposed on the protective layer 220. As described above, each of the organic light emitting diodes 310 may be disposed for each of the color areas LA11, LA12, and LA13. For example, each of the display pixels PXa (see FIG. 5) may include an organic light emitting diode 310. Hereinafter, constituent elements of each organic light emitting diode 310 will be described in detail.

Referring to FIG. 11 and FIG. 12 together, first pixel electrodes 311 may be disposed on the protective layer 220. Each of the first pixel electrodes 311 may be a pixel electrode disposed for each color area. First pixel electrodes 311 may be an anode of an organic light emitting diode 310.

Each of the first pixel electrodes 311 may be electrically connected to the drain electrodes D1, D2, D3, (or source electrodes S1, S2, and S3) disposed on the display substrate 101 through a via hole passing through the protective layer 220.

First pixel electrodes 311 may be formed of a material having a high work function. First pixel electrodes 311 may include indium-tin-oxide (ITO), indium-zinc-oxide (IZO), zinc oxide (ZnO), and indium oxide (In2O3) and the like.

In an embodiment, an area occupied on a plane by each of the first pixel electrodes 311 may be substantially the same as each other in each of the color areas LA11, LA12, and LA13, but embodiments are not limited thereto.

A pixel definition layer 330 may be disposed on first pixel electrodes 311. The pixel definition layer 330 includes an opening that exposes at least a portion of each of the first pixel electrodes 311. In an embodiment, in each of the color areas LA11, LA12, and LA13, a width of each opening may be different from each other. For example, the opening of the second color area LA12, the opening of the first color area LA11 and the opening of the third color area LA13 may have a narrower width sequentially. For example, an area of each first pixel electrode 311 exposed by the pixel definition layer 330 may be wider in order of the third color area LA13, the first color area LA11 and the second color area LA12.

The pixel definition layer 330 may include an organic material or an inorganic material. In an embodiment, the pixel definition layer 330 may include a material such as a photo resist, a polyimide-based resin, an acryl-based resin, a silicon compound, a polyacrylate-based resin, or the like.

An organic emission layer 320 may be disposed on each first pixel electrode 311 exposed by the pixel definition layer 330. For example, the organic emission layer 320 may have a form in which a first hole transport layer HTL1, a first emission layer EL11 and a first electron transport layer ETL1 may be disposed (e.g., sequentially disposed). In an embodiment, the organic emission layer 320 of each of the color areas LA11, LA12, and LA13 may be all organic emission layer 320 (e.g., of blue), but embodiments are not limited thereto.

A second pixel electrode 312 may be disposed on the first electron transport layer ETL1. The second pixel electrode 312 may be a common electrode disposed throughout the display substrate 101 without distinguishing each of the color areas LA11, LA12, and LA13. The second pixel electrode 312 may be a cathode of an organic light emitting diode 310.

The second pixel electrode 312 may be formed of a material having a low work function. The second pixel electrode 312 may include Li, Ca, LiF/Ca, LiF/Al, Al, Mg, Ag, Pt, Pd, Ni, Au Nd, Ir, Cr, BaF, Ba, compounds thereof, or mixtures thereof (e.g., mixture of Ag and Mg, etc.). The second pixel electrode 312 may further include an auxiliary electrode. The auxiliary electrode may include a layer formed by depositing the material and transparent metal oxide formed on the layer, for example, indium-tin-oxide (ITO), indium-zinc-oxide (IZO), zinc oxide (ZnO), indium-tin-zinc-oxide, and the like.

In case that the display device 1 may be a front emission type, to form the second pixel electrode 312, a thin film may be formed of a conductive layer having a small work function, and a transparent conductive layer, for example, an indium tin oxide (ITO) layer, an indium-zinc-oxide (IZO) layer, a zinc oxide (ZnO) layer, an indium oxide (In2O3) layer, and the like may be formed on the thin film.

In each of the color areas LA11, LA12, and LA13, the first pixel electrode 311, the first hole transport layer HTL1, the first emission layer EL11, the first electron transport layer ETL1, and second pixel electrode 312 described above may be constitute one organic light emitting diode 310.

A type and a stacked order of the organic light emitting diode 310 are not limited to those shown in the drawing. Various embodiments of an organic light emitting diode 310, may be applied to the display device 1 and some of the various embodiments will be described later with reference to FIGS. 13 and 14.

The first pixel electrode 311 to the second pixel electrode 312 may correspond to the light emitting element layer 10c of FIG. 10.

The first encapsulation layer 400 may be disposed on the second pixel electrode 312. Here, the first encapsulation layer 400 may correspond to the first encapsulation layer 10d of FIG. 10.

The first encapsulation layer 400 may include an inorganic layer and/or an organic layer. The first encapsulation layer 400 may include layers (e.g., stacked layers). The first encapsulation layer 400 may be formed of a multiple layer including a first inorganic layer 410, an organic layer 420, and a second inorganic layer 430 stacked (e.g., sequentially stacked) on the second pixel electrode 312.

The first inorganic layer 410 and the second inorganic layer 430 may include at least one selected from the group of silicon oxide (SiOx), silicon nitride (SiNx), and silicon oxynitride (SiONx).

The organic layer 420 may include any one selected from the group of epoxy, acrylate or urethane acrylate.

Hereinafter, constituent elements corresponding to the color conversion element layer 10e of FIG. 10 will be described in more detail.

The color conversion element layer 10e may include a second buffer layer 501, a black matrix 521, a first color conversion filter, a first capping layer 511, a second color conversion filter, a second capping layer 512, an overcoat layer 513, and a passivation layer 514, and a cover layer 550 that are stacked (e.g., sequentially stacked) on the first encapsulation layer 400. The color conversion element layer 10e may further include a light transmission pattern 533 formed on the same layer as the first color conversion filter.

A light emitting area including each of the color areas LA11, LA12, and LA13 and a non-light emitting area NLA may be defined by the color conversion element layer 10e.

The second buffer layer 501 may be disposed on the first encapsulation layer 400. The second buffer layer 501 may smooth a surface of the first encapsulation layer 400 and prevent penetration of moisture or outside air into the first encapsulation layer 400. The second buffer layer 501 may be an inorganic layer. The second buffer layer 501 may be a single layer or a multiple layer. In another embodiment, the second buffer layer 501 may be omitted.

In another embodiment, a separate filling material may be disposed between the first encapsulation layer 400 and the second buffer layer 501. In another embodiment, an upper surface of the first encapsulation layer 400 and a lower surface of the first color conversion filter described later may be disposed to be in direct contact with each other.

The black matrix 521 may be disposed on the second buffer layer 501. The black matrix 521 may be disposed along a boundary of each of the color areas LA11, LA12, and LA13, and may block a transmission of light. The black matrix 521 may overlap the pixel definition layer 330. The black matrix 521 may include an opening in which each of the color areas LA11, LA12, and LA13 may be defined.

A material of the black matrix 521 is not particularly limited as long as it may block light. In an embodiment, the black matrix 521 may be formed of a photosensitive composition, an organic material, a metallic material, and the like. In an embodiment, the photosensitive composition may include a binder resin, a polymerizable monomer, a polymerizable oligomer, a pigment, a dispersant, and the like. The metallic material may include chromium and the like.

The first color conversion filter may be disposed on the second buffer layer 501 and the black matrix 521. The first color conversion filter may overlap the opening of the black matrix 521.

In an embodiment, the first color conversion filter may be a color filter 540. The color filter 540 may selectively transmit light of a specific color, but block light by absorbing light of a different color. The light passing through the color filter 540 may display one of the primary colors, such as one of the three primary colors of red, green, and blue. However, a display color of the light passing through the color filter 540 may not be limited to a primary color, and embodiments may display other colors such as any one of cyan, magenta, yellow and white colors.

In an embodiment of the invention, the first color conversion filter may include a first color filter 541, a second color filter 542, and a third color filter 543. As an example, the first, second and third color filters 541, 542 and 543 may be red, green and blue color filters, respectively.

The first color filter 541 may be disposed in the first color area LA11. The first color filter 541 may transmit light of the first color, but absorb and block light of the second color and light of the third color. Here, the first color may be red, the second color may be green, and the third color may be blue. For example, the first color filter 541 may be a red color filter and may include a red colorant. The red color filter may transmit red light, but absorb and block green and blue light.

The second color filter 542 may be disposed in the second color area LA12. The second color filter 542 may transmit light of the second color, but absorb and block light of the first color and light of the third color. For example, the second color filter 542 may be a green color filter and may include a green colorant. The green color filter may transmit green light, but absorb and block red and blue light.

The third color filter 543 may be disposed in the third color area LA13. The third color filter 543 may transmit light of the third color, but absorb and block light of the first color and light of the second color. For example, the third color filter 543 may be a blue color filter and may include a blue colorant. The blue color filter may transmit blue light, but absorb and block red and green light.

Since the color filter may absorb significant amounts of external light, an external light reflection may be reduced without disposing an additional polarizer.

In an embodiment, a boundary between the color filters may be disposed in the non-light emitting area NLA. For example, the boundary between the color filters may overlap the black matrix 521.

The first capping layer 511 may be disposed on the first color conversion filter. The first capping layer 511 may prevent impurity such as moisture or air from penetrating from the outside to damage or contaminate the first color conversion filter. The first capping layer 511 may prevent the colorant included in the color filter from being diffused into different constituent elements.

In some embodiments, the first capping layer 511 may be formed of an inorganic material. For example, the first capping layer 511 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon acid nitride, and the like.

The second color conversion filter and the light transmission pattern 533 may be disposed on the first capping layer 511. A thickness of the second color conversion filter and the light transmission pattern 533 may be about 2 μm to about 20 μm.

The second color conversion filter may be a wavelength conversion pattern 530. The wavelength conversion pattern 530 may emit an incident light by converting a peak wavelength of the incident light into another specific peak wavelength. The light passing through the wavelength conversion pattern 530 may display one of the primary colors, such as the three primary colors of red, green, and blue. However, a display color of the light passing through the wavelength conversion pattern 530 may not be limited to a primary color, and may display any other colors such as one of cyan, magenta, yellow and white colors.

In an embodiment of the invention, the wavelength conversion pattern 530 may include a first wavelength conversion pattern 531 and a second wavelength conversion pattern 532 that may be different from each other.

The first wavelength conversion pattern 531 may be disposed in the first color area LA11. In an embodiment, the first wavelength conversion pattern 531 may emit red light by converting blue light into red light in a range of about 610 nm to about 650 nm. The first wavelength conversion pattern 531 may not be disposed in the second color area LA12 and the third color area LA13.

The first wavelength conversion pattern 531 may include a first base resin 5311 and a first wavelength conversion material 5313 dispersed in the first base resin 5311, and may further include a first scatterer 5315 dispersed in the first base resin 5311.

A material of the first base resin 5311 may not be particularly limited as long as it has a high light transmittance and an excellent dispersion characteristic for the first wavelength conversion material 5313 and the first scatterer 5315. For example, the first base resin 5311 may include an organic material such as an epoxy-based resin, an acryl-based resin, a cardo resin, an imide resin, and the like.

The first wavelength conversion material 5313 may convert the peak wavelength of the incident light into another specific peak wavelength. The first wavelength conversion material 5313 may include a quantum dot (QD), a quantum rod, a phosphor, and the like. The quantum dot may be a particulate material that emits light of a specific wavelength as electrons transition from conduction bands to valence bands.

The quantum dot may be a semiconductor nano crystalline material.

Since the quantum dot has a specific bandgap according to a composition and a size thereof, the quantum dot may absorb light and emit light with a unique wavelength. Semiconductor nanocrystals of the quantum dot may include group IV nanocrystals, group II-VI compound nanocrystals, group III-V compound nanocrystals, group IV-VI nanocrystals, a combination thereof, and the like.

For example, the group IV nanocrystals may include silicon (Si), germanium (Ge), or two-element compounds such as silicon carbide (SiC) and silicon-germanium (SiGe), but embodiments are not limited thereto.

The group II-VI compound nanocrystals may include two-element compounds such as CdSe, CdTe, ZnS, ZnSe, ZnTe, ZnO, HgS, HgSe, HgTe, MgSe, MgS, and mixtures thereof, three-element compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, or four-element compounds such as HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof, but embodiments are not limited thereto.

The group III-V compound nanocrystals may include two-element compounds such as GaN, GaP, GaAs, GaSb, AlN, AlP, AlAs, AlSb, InN, InP, InAs, InSb and mixtures thereof, three-element compounds such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP and mixtures thereof, or four-element compounds such as GaAl-NAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof, but embodiments are not limited thereto.

The group IV-VI nanocrystals may include two-element compounds such as SnS, SnSe, SnTe, PbS, PbSe, PbTe and mixtures thereof, three-element compounds such as SnSeS, SnSeTe, SnSTe, PbSeS, PbSeTe, PbSTe, SnPbS, SnPbSe, SnPbTe and mixtures thereof, or four-element compounds such as SnPbSSe, SnPbSeTe, SnPbSTe and mixtures thereof, but embodiments are not limited thereto.

The quantum dot may have a core-shell structure including a core that may include the nanocrystals described above and a shell that may surround a core. The shell of the quantum dot may serve as a protective layer to prevent chemical denaturation of the core to maintain a semiconductor characteristic of the core and/or as a charging layer to impart an electrophoretic characteristic to the quantum dot. The shell may be single layer or a multiple layer. The shell of the quantum dot may be oxide of a metal or nonmetal, a semiconductor compound or a combination thereof.

For example, the oxide of the metal or nonmetal may be two-element compounds such as $SiO2$, $Al_2O_3$, $TiO2$, ZnO, MnO, Mn2O3, Mn3O4, CuO, FeO, Fe2O3, Fe3O4, CoO, Co3O4, or NiO, or three-element compounds such as MgAl2O4, CoFe2O4, NiFe2O4, or CoMn2O4, but embodiments are not limited thereto.

The semiconductor compound may be CdS, CdSe, CdTe, ZnS, ZnSe, ZnTe, GaAs, GaP, GaSb, HgS, HgSe, HgTe, InAs, InP, InSb, AlAs, AlP, AlSb, or the like, but the embodiments are not limited thereto.

The light emitted by the first wavelength conversion material 5313 may have full width of half maximum (FWHM) of a light emitting wavelength spectrum of about 45 nm or less, or about 40 nm or less, or about 30 nm or less, thereby improving color purity and color reproducibility of a color displayed by the display device. The light emitted by the first wavelength conversion material 5313 may be emitted in various directions regardless of the incident direction of the incident light. Therefore, side visibility of the display device may be improved.

Some of an emission light L provided from the organic light emitting diode 310 may be emitted through the first wavelength conversion pattern 531 without being converted into red light by the first wavelength conversion material 5313. A component incident to the first color filter 541 without being converted by the first wavelength conversion pattern 531 may be blocked by the first color filter 541. The red light converted by the first wavelength conversion pattern 531 may be emitted to the outside through the first color filter 541. Accordingly, the first emission light L1 emitted to the outside in the first color area LA11 may be red light.

The first scatterer 5315 may form an optical interface with a first base resin 5311 with a refractive index different from that of the first base resin 5311. For example, the first scatterer 5315 may be a light scattering particle. The first scatterer 5315 may not be particularly limited as long as it may be a material capable of scattering at least a portion of transmitted light, and may be, for example, metal oxide particles or organic particles. The metal oxide may include titanium oxide (TiO2), zirconium oxide (ZrO2), aluminum oxide ($Al_2O_3$), indium oxide (In2O3), zinc oxide (ZnO) or tin oxide (SnO2), and the organic particle material may be acryl-based resin or urethane-based resin, or the like. The first scatterer 5315 may scatter light in a random direction regardless of the incident direction of the incident light without substantially converting the wavelength of light transmitted through the first wavelength conversion pattern 531. Therefore, a path length of the light transmitted through the first wavelength conversion pattern 531 may be increased and a color conversion efficiency by the first wavelength conversion material 5313 may be increased.

In some embodiments, a thickness of the first wavelength conversion pattern 531 may be 3 μm to 15 μm. A content of the first wavelength conversion material 5313 included in the first wavelength conversion pattern 531 may be 10% to 60%. A content of the first scatterer 5315 included in the first wavelength conversion pattern 531 may be 2% to 15%.

The second wavelength conversion pattern 532 may be disposed in the second color area LA12. In an embodiment, the second wavelength conversion pattern 532 may emit green light by converting blue light into green light ranging from about 510 nm to about 550 nm. The second wavelength conversion pattern 532 may not be disposed in the first color area LA11 and the second color area LA12.

The second wavelength conversion pattern 532 may include the second base resin 5321 and a second wavelength conversion material 5323 dispersed in the second base resin 5321, and may further include a second scatterer 5325 dispersed in the second base resin 5321.

The second base resin 5321 may not be particularly limited as long as it has a high light transmittance and an excellent dispersion characteristic for the second wavelength conversion material 5323 and the second scatterer 5325. For example, the second base resin 5321 may include an organic material such as an epoxy-based resin, an acryl-based resin, a cardo resin, an imide resin, or the like.

The second wavelength conversion material 5323 may include a quantum dot (QD), a quantum rod, a phosphor, and the like. Other details of the second wavelength conversion material 5323 may be omitted since they may be equivalent or similar to those of the first wavelength conversion material 5313 described above.

Both the first wavelength conversion material 5313 and the second wavelength conversion material 5323 may be formed of a quantum dot. A diameter of the quantum dot forming the first wavelength conversion material 5313 may be greater than a diameter of the quantum dot forming the second wavelength conversion material 5323. For example, a size of the quantum dot of the first wavelength conversion material 5313 may be about 55 Å to about 65 Å. A size of the quantum dot of the second wavelength conversion material 5323 may be about 40 Å to about 50 Å.

The light transmitted through the first wavelength conversion pattern 531 and the second wavelength conversion pattern 532 may be unpolarized. An unpolarized light refers to light that may not be formed of only a polarization component in a specific direction, for example, light that may not be polarized only in a specific direction, or light formed of a random polarization component. The unpolarized light may be natural light.

The second scatterer 5325 may form an optical interface with a second base resin 5321 with a refractive index different from that of the second base resin 5321. For example, the second scatterer 5325 may be a light scattering particle. Other details of the second scatterer 5325 may be omitted since they may be equivalent or similar to those of the first scatterer 5315 described above.

A content of the second wavelength conversion material 5323 included in the second wavelength conversion pattern 532 may be 10% to 60%. A content of the second scatterer 5325 included in the second wavelength conversion pattern 532 may be 2% to 15%.

An emission light L emitted from the organic light emitting diode 310 may be provided to the second wavelength conversion pattern 532, and the second wavelength conversion material 5323 may emit green light by converting the emission light L provided from the organic light emitting diode 310 into the green light.

Some of the emission light L provided from the organic light emitting diode 310 may be emitted through the second wavelength conversion pattern 532 without being converted to green light by the second wavelength conversion material 5323, and such an emission light L may be blocked by the second color filter 542. The green light converted by the second wavelength conversion pattern 532 among the emission light L may be transmitted through the second color filter 542 to be emitted to the outside. Accordingly, the second emission light L2 emitted to the outside may be green light in the second color area LA12.

A light transmission pattern 533 may be disposed in the third color area LA13 and not in the first color area LA11 and the second color area LA12. The light transmission pattern 533 may generally transmit incident light as it may be.

The light transmission pattern 533 may further include a third base resin 5331 and a third scatterer 5335 dispersed in the third base resin 5331.

The third base resin 5331 may be formed of an organic material having high light transmittance, and may be formed of the same material as the first base resin 5311 or include at least one of materials exemplified as constituent materials of the first base resin 5311.

The third scatterer 5335 may form an optical interface with a third base resin 5331 with a refractive index different from that of the third base resin 5331. For example, the third scatterer 5335 may be a light scattering particle. The third scatterer 5335 may not be particularly limited as long as it may be a material capable of scattering at least a portion of transmitted light, and may be, for example, metal oxide particles or organic particles. The metal oxide may include titanium oxide (TiO2), zirconium oxide (ZrO2), aluminum oxide ($Al_2O_3$), indium oxide (IN2O3), zinc oxide (ZnO) or tin oxide (SnO2), and the organic particle material may be acryl-based resin or urethane-based resin, or the like. The third scatterer 5335 may scatter light in a random direction regardless of the incident direction of the incident light without substantially converting the wavelength of light transmitted through the light transmission pattern 533. Therefore, side visibility of the light transmitted through the light transmission pattern 533 may be improved.

The emission light L provided from the organic light emitting diode 310 may transmit through the light transmission pattern 533 and the third color filter 543 to be emitted to the outside. For example, the third emitted light L3 emitted from the third color area LA13 may have the same wavelength as the emission light L which may be blue light emitted from the organic light emitting diode 310.

The first wavelength conversion pattern 531, the second wavelength conversion pattern 532 and the light transmission pattern 533 may be formed to be spaced apart from each other in a plan view. As a result, materials included in the first wavelength conversion pattern 531, the second wavelength conversion pattern 532, and the light transmission pattern 533 may not be mixed with each other. A separation space may be formed among the first wavelength conversion pattern 531, the second wavelength conversion pattern 532, and the light transmission pattern 533.

The second capping layer 512 may be disposed on the first wavelength conversion pattern 531, the second wavelength conversion pattern 532 and the light transmission pattern 533. The second capping layer 512 may cover the first wavelength conversion pattern 531, the second wavelength conversion pattern 532 and the light transmission pattern 533. The second capping layer 512 may be disposed among the first wavelength conversion pattern 531, the second wavelength conversion pattern 532 and the light transmission pattern 533 with including the separation space. In the separation space, the second capping layer 512 may contact (e.g., directly contact) the first capping layer 511.

The second capping layer 512 may seal the first wavelength conversion pattern 531, the second wavelength conversion pattern 532 and the light transmission pattern 533 together with the first capping layer 511, thereby preventing impurity such as moisture or air that may penetrate from the outside from damaging or contaminating the first wavelength conversion pattern 531, the second wavelength conversion pattern 532 and the light transmission pattern 533. The second capping layer 512 may correspond to a roof layer to be described later.

The second capping layer 512 may be formed of inorganic material. The second capping layer 512 may be formed of the same material as the first capping layer 511 or may include at least one of the materials mentioned in the description of the first capping layer 511.

A thickness of the second capping layer 512 may be about 1000 Å to about 20000 Å. In some embodiments, a thickness of the second capping layer 512 may be about 4000 Å. The second capping layer 512 may be formed as a single layer, but embodiments are not limited thereto.

The overcoat layer 513 may be disposed on the second capping layer 512. The overcoat layer 513 may serve to protect wavelength conversion patterns and the light transmission pattern while planarizing the second capping layer 512. The overcoat layer 513 may be formed of an acryl-based epoxy material in general, but embodiments are not limited thereto.

The passivation layer 514 may be disposed on the overcoat layer 513.

The light emitting area may be covered by the passivation layer 514. The passivation layer 514 may include an inorganic insulation material such as silicon oxide (SiOx), silicon nitride (SiNx), silicon oxynitride (SiON), and the like.

Although not separately shown in FIG. 10, the display part 10 may further include an upper substrate 560 disposed on the color conversion element layer 10e.

In an embodiment, the upper substrate 560 may be disposed on the passivation layer 514. The upper substrate 560 may be formed of a material having light transmission. The upper substrate 560 may be a rigid substrate or a flexible substrate. In an embodiment, the upper substrate 560 may be a window member or an encapsulation substrate.

In case that the upper substrate 560 may be a rigid substrate, the upper substrate 560 may be one of a glass substrate, a quartz substrate, a glass ceramic substrate, and a crystalline glass substrate. In case that the upper substrate 560 may be a flexible substrate, the upper substrate 560 may be one of a film substrate including a polymer organic material and a plastic substrate. The upper substrate 560 may include fiber glass reinforced plastic (FRP).

Various embodiments of the organic light emitting diode 310 described above will be described later.

Referring to FIG. 13, the organic emission layer 320_1 may further include a first charge generation layer CGL11 disposed on a first emission layer EL11 and a second emission layer EL12 disposed on the first charge generation layer CGL11, and the first charge transport layer ETL1 may be disposed on the second emission layer EL12.

The first charge generation layer CGL11 may serve to inject a charge to adjacent emission layer. The first charge generation layer CGL11 may serve to adjust a charge balance between the first emission layer EL11 and the second emission layer EL12. In some embodiments, the first charge generation layer CGL11 may include an n-type charge generation layer and a p-type charge generation layer. The p-type charge generation layer may be disposed on the n-type charge generation layer.

The second emission layer EL12 may not be limited thereto, but may emit blue light like the first emission layer EL11. The second emission layer EL12 may emit blue light having the same peak wavelength or a different peak wavelength as the first emission layer EL11. In another embodiment, the first emission layer EL11 and the second emission layer EL12 may emit light of different colors. For example, the first emission layer EL11 may emit blue light while the second emission layer EL12 may emit green light.

The organic emission layer 320_1 of the above-described structure includes two emission layers, thereby improving a luminous efficiency and a life-span compared to the structure of FIG. 5.

Referring to FIG. 14, the organic emission layer 320_2 may include three emission layers EL11, EL12, and EL13, and two charge generating layers CGL11 and CGL12 interposed therebetween. As shown in FIG. 14, the organic emission layer 320_2 may further include a first charge generation layer CGL11 disposed on the first emission layer EL11, a second emission layer EL12 disposed on the first charge generation layer CGL11, a second charge generation layer CGL12 disposed on the second emission layer EL12, and a third emission layer EL13 disposed on the second charge generation layer CGL12. The first charge transport layer ETL1 may be disposed on the third emission layer EL13.

The third emission layer EL13 may emit blue light like the first emission layer EL11 and the second emission layer EL12. In an embodiment, each of the first emission layer EL11, the second emission layer EL12, and the third emission layer EL13 emits blue light, and all the wavelength peaks thereof may be the same, or some of the wavelength peaks thereof may be different. In another embodiment, emission colors of the first emission layer EL11, the second emission layer EL12, and the third emission layer EL13 may be different. For example, each emission layer may emit blue light or green light, or each emission layer may emit red light, green light, and blue light, thereby emitting white light as a whole.

Referring to FIGS. 15 and 16, the stacked structure of the light receiver 20 will be described. A case where elements or layers may be "disposed on" other elements or layers in FIGS. 15 and 16 may mean a case where they may be stacked in the back surface or sensing direction of another element with respect to FIG. 10.

The sensing substrate 601 may be a rigid substrate or a flexible substrate. A material of the sensing substrate 601 may be selected from the materials of the display substrate 101. In an embodiment, the sensing substrate 601 may be an opaque substrate. At least one of the display substrate 101 and the sensing substrate 601 may be an opaque substrate.

An insulation structure 700 may be disposed on the sensing substrate 601.

A metal line layer 730 that may be formed in absorption areas SA11, SA12, and SA13 and may include multi-layered sensing lines 731, 732, and 733, stacked (e.g., sequentially stacked), and sensing circuits 710 and 720 formed in a non-sensing area NSA may be interposed in the insulation structure 700. Each of sensing circuits 710 and 720 may include lines 711, 713, 715, 717, and 721 and line contacts 712 connecting the lines 711, 713, 715, 717, and 721.

The sensing circuits 710 and 720 may be driving circuits for driving the active sensing pixel APS of the light receiver 20, for example, a circuit related to a controller 30, a row decoder 22, a row driver 23, a correlated double sampler 24, an analog digital converter 25, a latch 26, and a column decoder 27 of FIG. 7.

In FIG. 16, the first circuit 710 and the second circuit 720 may be formed in the non-sensing area NSA, and the first circuit 710 may include a first to fourth line 711, 713, 715, and 717 and a line contact 712 connecting the first to fourth lines 711, 713, 715, and 717. However, this is exemplary and the structure of the circuit is not limited thereto.

The stacked structure may be formed of the insulation structure 700, the metal line layer 730 and the sensing circuit 710 and 720, and may correspond to the second circuit layer 20b of FIG. 10.

Although not shown in FIG. 15, an adhesive layer may be interposed between the sensing substrate 601 and the insulation structure 700 to bond the sensing substrate 601 and the insulation structure 700. In case that the sensing substrate 601 may be a silicon substrate, the adhesive layer may be, for example, a silicon oxide layer.

A sensing element layer 20c disposed on the insulation structure 700 may include an element isolation structure 812 that may distinguish the absorption areas SA11, SA12, and SA13. For example, the element isolation structure 812 may be a shallow trench isolation (STI) or a local oxidation of silicon (LOCOS).

The sensing element layer 20c may be in the form of various kinds of substrates. For example, the sensing element layer 20c may be a first conductive (e.g., P-type) or second conductive (e.g., N-type) bulk substrate. The sensing element layer 20c may be formed by growing a first conductive or second conductive epi layer on the first conductive bulk substrate, or may be formed by growing the first conductive or second conductive epi layer on the second conductive bulk substrate.

The sensing element layer 20c may be formed of an organic plastic substrate or the like in addition to the semiconductor substrate in some embodiments. FIG. 15 shows the sensing element layer 20c of a case where all of the bulk substrate may be removed and only the epi layer may be left through a polishing process, but the embodiments are not limited thereto, and a portion of the bulk substrate may be left as necessary. A thickness of the remaining sensing element layer 20c may be, for example, about 3 μm to about 5 μm.

Photoelectric conversion elements 820R, 820G, and 820B, and floating diffusion regions 823 may be formed in the sensing element layer 20c of each of the absorption areas SA11, SA12, and SA13. Gates 740 may be disposed under the sensing element layer 20c. For example, a gate 740 may be a gate of a charge transfer element, a gate of a reset element, a gate of a drive element, and the like.

In an embodiment, the photoelectric conversion elements 820R, 820G, and 820B may be implemented in a form of photodiodes. FIG. 15 shows pinned photodiodes as an example of photoelectric conversion elements 820R, 820G, and 820B. For example, the photoelectric conversion elements 820R, 820G, and 820B may include an impurity region 821 of the second conductive type (e.g., N type) and an impurity region 822 of the first conductive type (e.g., P type).

In an embodiment, the photoelectric conversion elements 820R, 820G, and 820B may be formed using the same process as that of organic light emitting diodes. For example, the process may be a deposition or solution process.

In an embodiment, the sensing element layer 20c may include a first photoelectric conversion element 820R for sensing red light, a second photoelectric conversion element 820G for sensing green light, and a third photoelectric conversion element 820B for sensing blue light. The process related to the sensing may include a process absorbing light of a color for each photoelectric conversion element 820R, 820G, and 820B.

The first photoelectric conversion element 820R may include a material sensing red light. Phthalocyanine may be a representative material of the first photoelectric conversion element 820R. The second photoelectric conversion element 820G may include a material sensing green light. Boron subphthalocyanine chloride or N, N-dimethyl quinacridone may be a representative material of the second photoelectric conversion element 820G. The third photoelectric conversion element 820B may include a material sensing blue light. Triarylamines or oxadiazole-containing oligoaryls may be a representative material of the third photoelectric conversion element 820B.

However, the sensing element layer 20c may not be limited to the photoelectric conversion elements 820R, 820G, and 820B for sensing red light, green light, and blue light. In another embodiment, a photoelectric conversion element for sensing white light may be further included. In another embodiment, the sensing element layer 20c may include photoelectric conversion elements sensing other color light such as cyan, magenta, and yellow light instead of the first photoelectric conversion element 820R, the second photoelectric conversion element 820G and the third photoelectric conversion element 820B.

Upper pads, for example, a first upper pad 851 and second upper pad 852, and a contact hole that may pass through the sensing element layer 20c, for example, a first contact hole 841 and second contact hole 842 may be formed on the sensing element layer 20c in the non-sensing area NSA. The upper pads 851 and 852 may be formed on the sensing element layer 20c and at positions corresponding to the sensing circuits 710 and 720 formed under the sensing element layer 20c. For example, the first upper pad 851 may be disposed on the sensing element layer 20c to overlap the first circuit 710 and the second upper pad 852 may be disposed on the sensing element layer 20c to overlap the second circuit 720.

The contact holes 841 and 842 may pass through the upper and lower portions of the sensing element layer 20c and expose the sensing circuits 710 and 720 in the insulation structure 700. The first contact hole 841 may expose the first circuit 710, and the second contact hole 842 may expose the second circuit 720. For example, the first contact hole 841 and the second contact hole 842 may expose the first lines 711 and 721 disposed on a top of the sensing circuit 710 and 720, respectively.

The upper pads 851 and 852 may be formed from the upper portion of the sensing element layer 20c to an inside of the contact holes 841 and 842 and may be electrically connected to the sensing circuits 710 and 720. Here, the upper pads 851 and 852 may contact the sensing circuits 710 and 720 while filling only a portion of the contact holes 841 and 842, or may contact the sensing circuits 710 and 720 while completely filling the contact holes 841 and 842. FIG. 15 shows a case where the first lines 711 and 721 disposed at the top of the sensing circuits 710 and 720 contact the upper pads 851 and 852 so that the sensing circuits 710 and 720 and the upper pads 851 and 852 may be electrically connected to each other. The upper pads 151 and 152 may later be connected to an external circuit by wire bonding or the like.

The second encapsulation layer 830 may be disposed on the sensing element layer 20c. In an embodiment, the second encapsulation layer 830 may have the same stacked structure as the first encapsulation layer 400. For example, the second encapsulation layer 830 may be formed of a multiple layer including an inorganic layer, an organic layer, and an inorganic layer stacked (e.g., stacked sequentially).

The anti-reflection layer 910 may be disposed on the second encapsulation layer 830. The anti-reflection layer 910 may have a different material/thickness depending on a wavelength of light used in a photo process. For example, the anti-reflection layer 910 may be formed by stacking a silicon oxide layer having a thickness of about 50 to about 200 Å and a silicon nitride layer having a thickness of about 300 to about 500 Å.

A third buffer layer 930 may be disposed on the anti-reflection layer 910. The third buffer layer 930 may prevent the sensing element layer 20c from being damaged in a patterning process for forming the upper pads 851 and 852. For example, a silicon oxide layer having a thickness of about 3000 to about 8000 Å may be used as the third buffer layer 930.

Micro lenses 940 may be disposed on the third buffer layer 930. In an embodiment, at least one micro lens 940 may be disposed pre one absorption area. In the embodiment of FIG. 15, for example, one micro lens 940 may be disposed per one absorption area SA11, SA12, and SA13. For example, one micro lens 940 may overlap one of the photoelectric conversion elements 820R, 820G, and 820B. The micro lens 940 may change a path of light incident to areas other than the photoelectric conversion elements 820R, 820G, and 820B to focus light to the photoelectric conversion elements 820R, 820G, and 820B.

For example, the micro lens 940 may be formed of a TMR resin or an MFR resin.

A planarization layer 920 may be formed between the anti-reflection layer 910 and the micro lens 940, which may be an over coating layer. The planarization layer 920 may be formed of a thermosetting resin.

The stacked structure that may be formed of the anti-reflection layer 910 to the micro lens 940 may correspond to the photorefractive layer 20e shown in FIG. 10.

A manufacturing method of the micro lens 940 will be described with reference to FIGS. 17 to 19.

Figure 17:
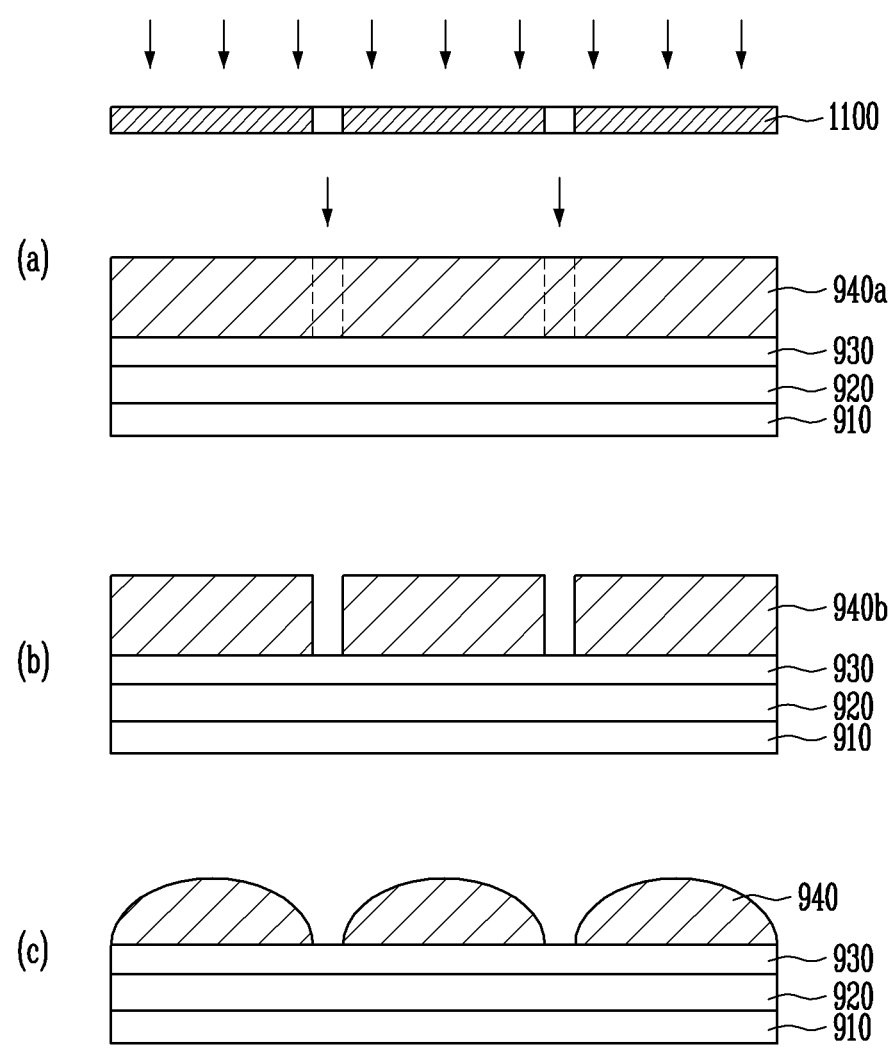
FIGS. 17 to 19 are schematic cross-sectional views showing various methods of manufacturing a micro lens according to an embodiment.
Figure 18:
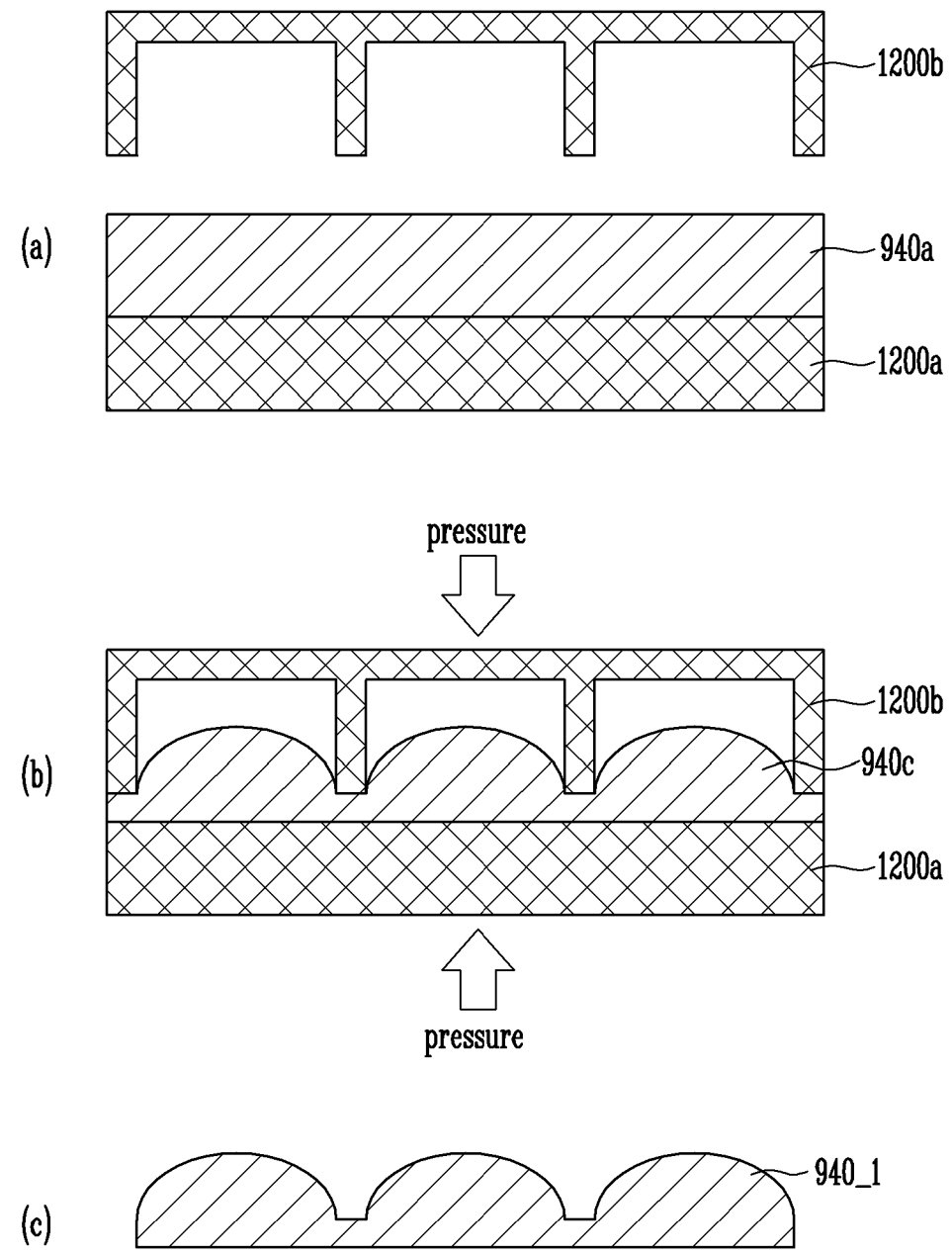
Figure 19:
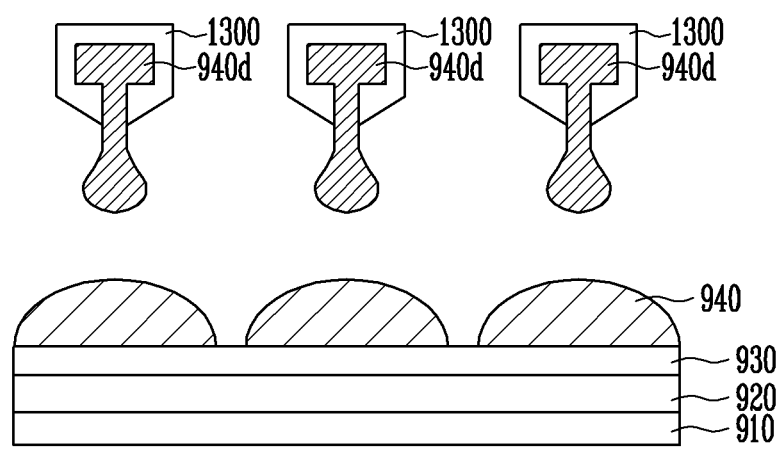

FIGS. 17 to 19 are schematic cross-sectional views showing various methods of manufacturing a micro lens according to an embodiment.

Referring to FIGS. 17 to 19, the micro lens 940 may be manufactured by a photoresist method, a hot molding method, or a printing method.

First, the photoresist method will be described.

As shown in part (a) of FIG. 17, a mask 1100 including a light transmitting portion and a non-light transmitting portion may be disposed so that the non-light transmitting portion may overlap a portion where the micro lens 940 is to be formed in a photosensitive resin 940a. An embodiment of the invention shows the photosensitive resin 940a of a positive type, but embodiments are not limited thereto.

As shown in part (b) of FIG. 17, the photosensitive resin 940a that has undergone an exposure process may be divided into a portion 940b in which the micro lens 940 may be to be formed.

As shown in part (c) of FIG. 17, for example, the micro lens 940 may be formed through a molding process such as polishing.

The hot molding method will be described.

As shown in part (a) FIG. 18, a polymer material 940a may be formed in a lower mold 1200a. An upper mold 1200b including a pattern for determining a shape of the micro lens 940 may be disposed on the polymer material 940a.

In case that heat may be applied to the upper mold 1200b and the lower mold 1200a and pressure may be applied from the outside as shown in part (b) of FIG. 18, a shape-deformation polymer material 940c may be molded in a shape corresponding to a pattern of the upper mold 1200b as shown in part (c) of FIG. 18.

As shown in part (c) of FIG. 18, the micro lens 940_1 may be formed through a post-treatment process or the like.

As shown in FIG. 19, a nozzle 1300 including a resin 940d may be disposed on the third buffer layer 930, and a micro lens 940 may be formed by printing on the third buffer layer 930.

Display devices according to another embodiment will be described.

Hereinafter, the description for the same constituent elements as those in FIGS. 1 to 19 will be omitted and the same or similar reference numerals will be used for the same constituent elements as those in FIGS. 1 to 19.

Figure 20:
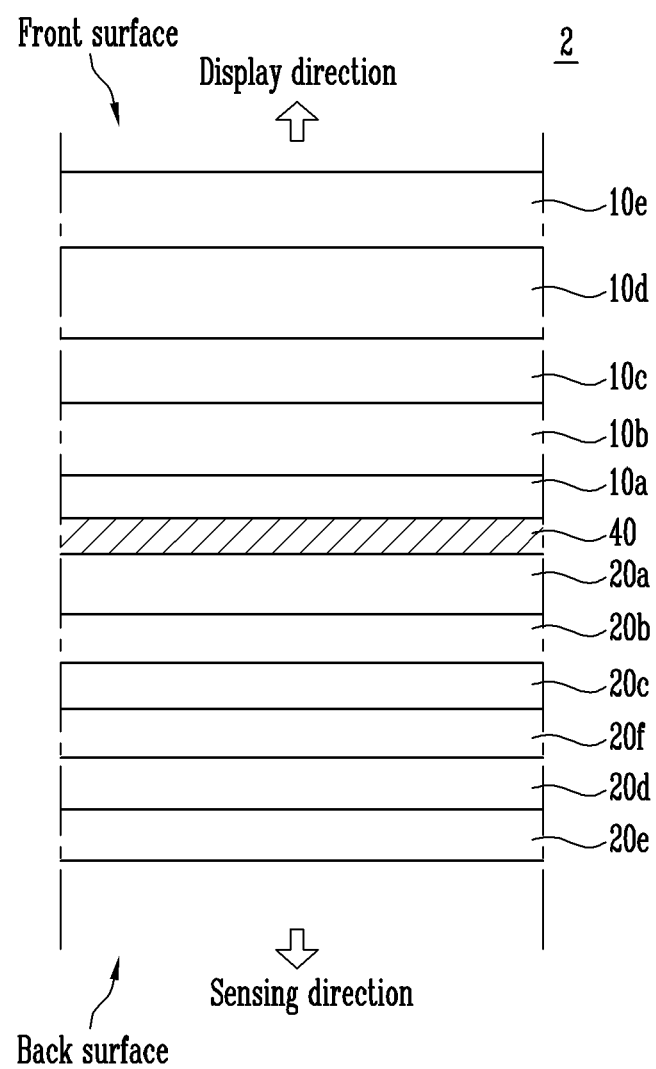
FIG. 20 is a schematic cross-sectional view of a display device according to another embodiment.
Figure 21:
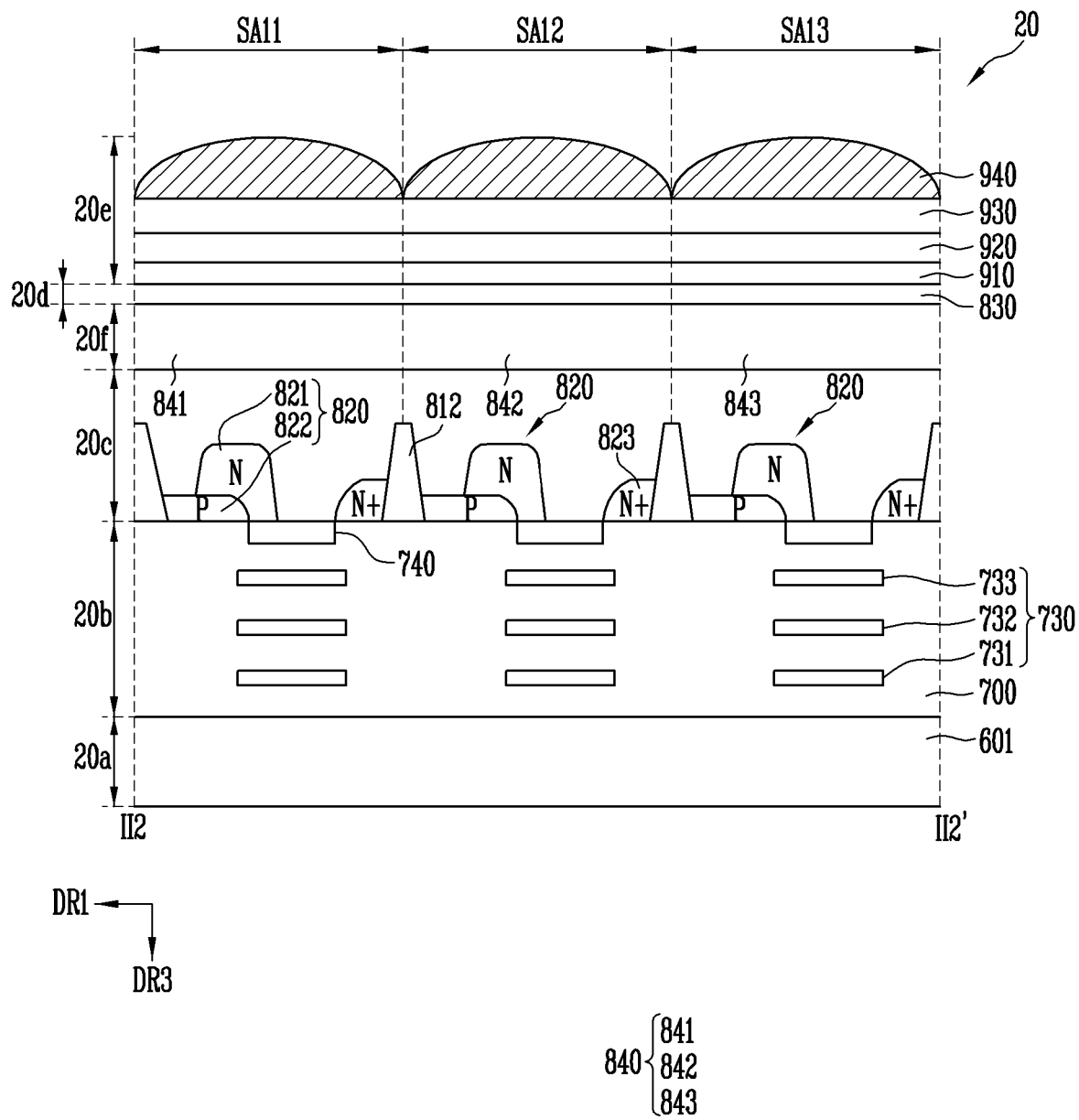
FIG. 21 is a cross-sectional view of a light receiver of a display device according to another embodiment.

FIG. 20 is a schematic cross-sectional view of a display device according to another embodiment. FIG. 21 is a cross-sectional view of a light receiver of a display device according to another embodiment.

Referring to FIGS. 20 and 21, a display device 2 according to an embodiment may be different from the display device 1 according to the embodiment of FIGS. 10 and 15 in that it may not be limited to the photoelectric conversion element 820 that may absorb light of different colors and further that may include a third color conversion filter 840.

All photoelectric conversion element 820s that may be disposed in each absorption area SA11, SA12, and SA13 may sense light of any color.

The light receiver 20 may further include a third color conversion filter 840 disposed between the sensing element layer 20c and the second encapsulation layer 20d. In an embodiment, the third color conversion filter 840 may be a color filter.

In an embodiment, the third color conversion filter 840 may have a shape in which color filters of different colors may be disposed in adjacent absorption areas SA11, SA12, and SA13. In an embodiment of the invention, the third color conversion filter 840 may include a fourth red color filter 841 disposed to overlap the first absorption area SA11, a fifth green color filter 842 disposed to overlap the second absorption area SA12, and a sixth blue color filter 843 disposed to overlap the third absorption area SA13.

Accordingly, the photoelectric conversion element 820 disposed in the first absorption area SA11 may sense red light, the photoelectric conversion element 820 disposed in the second absorption area SA12 may sense green light, and the photoelectric conversion element 820 disposed in the third absorption area SA13 may sense blue light.

Figure 22:
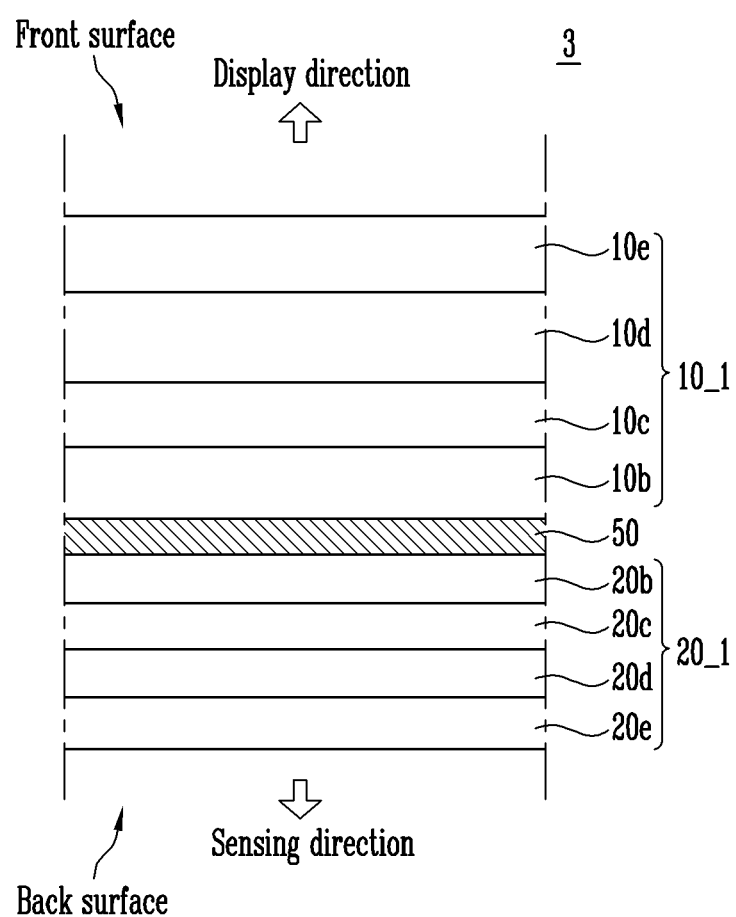
FIG. 22 is a schematic cross-sectional view of a display device according to another embodiment.

FIG. 22 is a schematic cross-sectional view of a display device according to another embodiment.

Referring to FIG. 22, a display device 3 according to an embodiment may be different from the display device 1 according to the embodiment of FIG. 10 in that it may include a base substrate 50 of a double surface type without bonding the display substrate 10a and the sensing substrate 20a.

The display device 3 may include a base substrate 50 of a double surface type. In an embodiment, the substrate may be a rigid substrate or a flexible substrate. The base substrate 50 of a double surface type may be one of the substrates illustrated in the display substrate 101.

A first circuit layer 10b to a color conversion element layer 10e of the display part 10_1 may be disposed (e.g., sequentially disposed) on a surface of a base substrate 50 of a double surface type, and the second circuit layer 20b to a photorefractive layer 20e of the light receiver 20_1 may be disposed (e.g., sequentially disposed) on another (or the other) surface thereof.

Accordingly, a thickness of the display device 3 may be thinner than the embodiment of FIG. 10.

Figure 23:
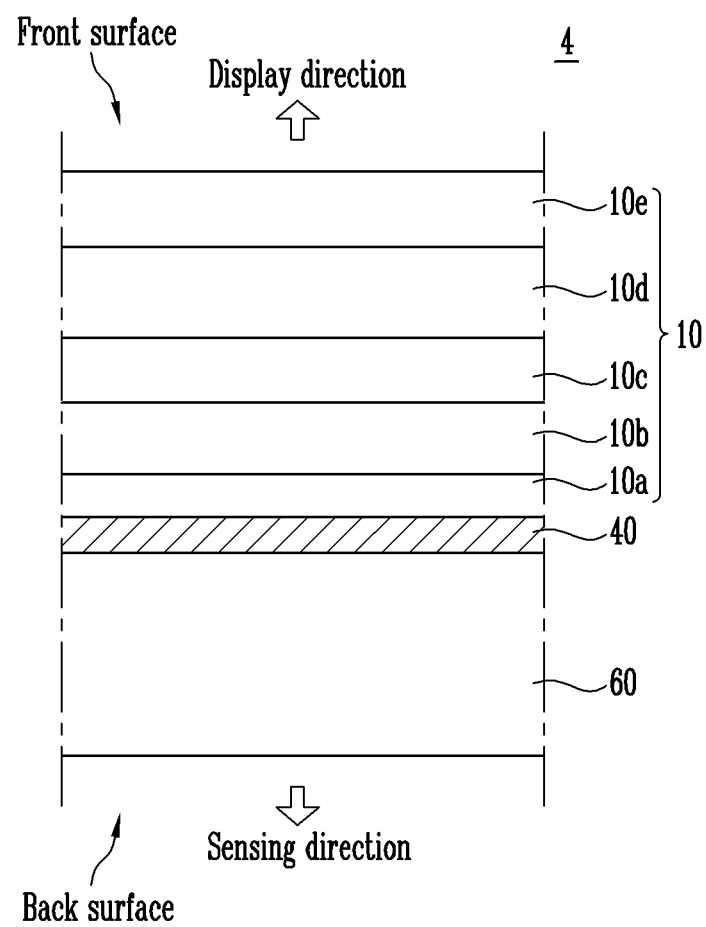
FIG. 23 is a schematic cross-sectional view of a display device according to another embodiment.
Figure 24:
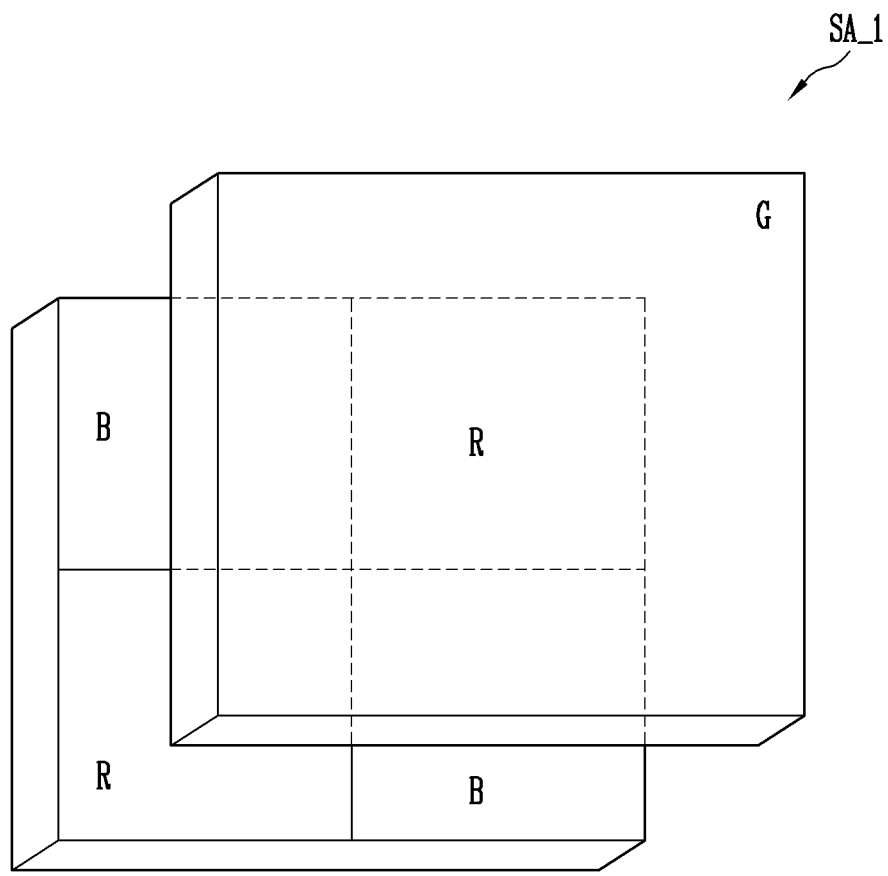
FIG. 24 is a schematic perspective view to help understand one absorption area according to another embodiment.
Figure 25:
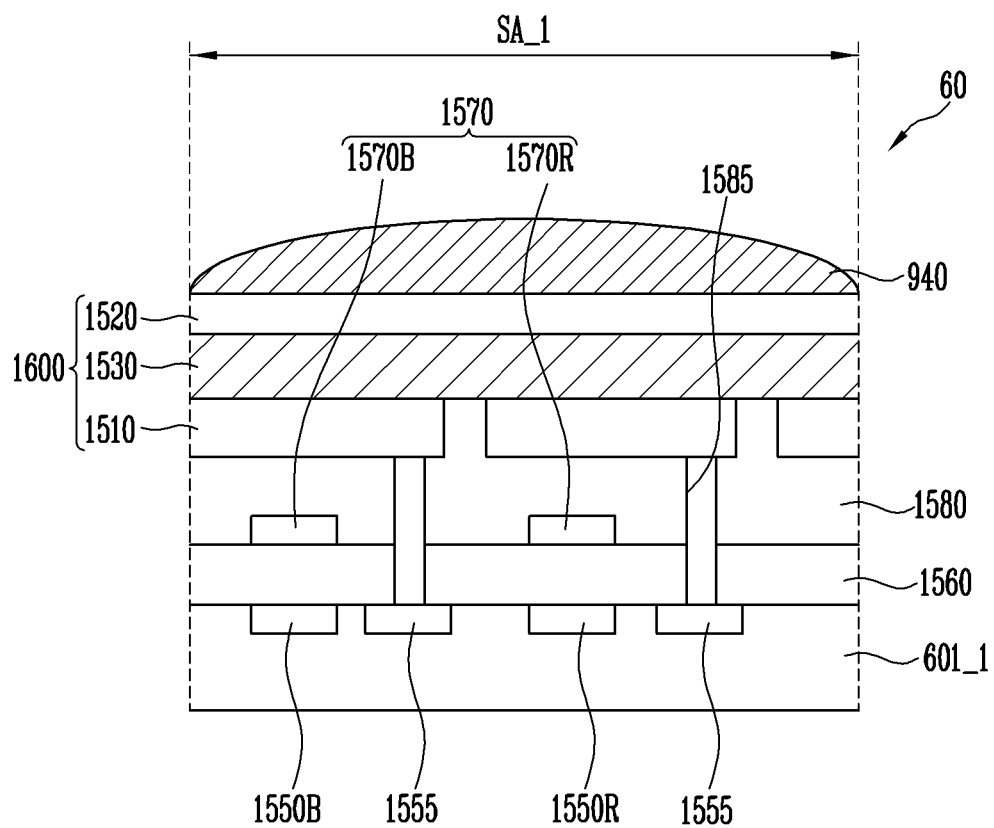
FIG. 25 is a schematic cross-sectional view of a light receiver of a display device according to another embodiment.

FIG. 23 is a schematic cross-sectional view of a display device according to another embodiment. FIG. 24 is a schematic perspective view to help understand one absorption area according to another embodiment. FIG. 25 is a schematic cross-sectional view of a light receiver of a display device according to another embodiment.

Referring to FIGS. 23 to 25, a display device 4 according to an embodiment may be different from the display device 1 according to the embodiment of FIG. 15 in that image sensing elements may be included in one absorption area SA_1.

In an embodiment, the light receiver 60 may be an organic CMOS image sensor.

The organic CMOS image sensor may include a semiconductor sensing substrate 601_1 in which light sensing elements 15506 and 1550R which may be image sensing elements, a transfer transistor (not shown) and a charge storage 1555 may be integrated, a lower insulation layer 1560, a color filter layer 1570, an upper insulation layer 1580, and a photoelectric element 1600.

The semiconductor sensing substrate 601_1 may be a silicon substrate, and may be integrated with the light sensing elements 15506 and 1550R, the transfer transistor (not shown) and the charge storage 1555. In an embodiment, the light sensing elements 15506 and 1550R may be photo diodes.

In an embodiment, the organic CMOS image sensor may include sensing pixels in one absorption area SA_1. The light sensing elements 15506 and 1550R, the transfer transistor and/or the charge storage 1555 may be integrated in each sensing pixel PXb. For example, the light sensing elements 15506 and 1550R may be included in the blue and red sensing pixels, and the charge storage 1555 may be included in the green sensing pixel.

The light sensing elements 1550B and 1550R may sense light. The sensed information may be transferred by the transfer transistor, the charge storage 1555 may be electrically connected to the photoelectric element 1600, and information in the charge storage 1555 may be transferred by the transfer transistor.

In the drawing, the light sensing elements 15506 and 1550R may be shown to be arranged side by side, but embodiments are not limited thereto and the blue light sensing element 1550B and the red light sensing element 1550R may be stacked vertically.

Although not shown, a metal line (not shown) and a pad (not shown) may also be disposed on the semiconductor sensing substrate 601_1. The metal line and the pad may be formed of a metal of low resistivity, for example, aluminum (Al), copper (Cu), silver (Ag) and alloys thereof to reduce signal delay, but embodiments are not limited thereto. For example, the metal line and the pad may be disposed under the light sensing elements 1550B and 1550R.

The lower insulation layer 1560 may be disposed on the metal line and the pad. The lower insulation layer 1560 may be formed of an inorganic insulation material such as silicon oxide and/or silicon nitride or a low dielectric constant (low K) material such as SiC, SiCOH, SiCO and SiOF. The lower insulation layer 1560 has a trench that exposes the charge storage 1555. The trench may be filled with a filler. The color filter layer 1570 may be formed on the lower insulation layer 1560. The color filter layer 1570 may include a blue filter 1570B formed on a blue sensing pixel and selectively transmitting blue light and a red filter 1570R formed on a red sensing pixel and selectively transmitting red light. In another embodiment, a cyan filter and a yellow filter may be disposed instead of the blue filter 1570b and red filter 1570R. An embodiment of the invention describes an example in which the green filter may not be provided. However, in some cases, the green filter may be provided.

The color filter layer 1570 may be omitted in some cases. For example, in a structure in which the blue light sensing element 1550B and the red light sensing element 1550R may be stacked vertically, the blue light sensing element 1550B and the red light sensing element 1550R may selectively absorb and/or sense light in each wavelength range according to a stacked depth, thereby not including a color filter layer 1570.

The upper insulation layer 1580 may be formed on the color filter layer 1570. The upper insulation layer 1580 may remove and flatten a step caused by the color filter layer 1570. The upper insulation layer 1580 and the lower insulation layer 1560 may have a contact hole (not shown) that may expose the pad and a penetration hole 1585 that may expose the charge storage 1555 of the green sensing pixel.

The photoelectric element 1600 may be formed on the upper insulation layer 1580. As described above, the photoelectric element 1600 may include a first electrode 1510, an active layer 1530, and a second electrode 1520.

Both the first electrode 1510 and the second electrode 1520 may be transparent electrodes, and the active layer 1530 may be as described above. The active layer 1530 may selectively absorb and/or sense light in a green wavelength range and replace the color filter of the green sensing pixel.

Light incident from a position of the second electrode 1520 may be photoelectrically converted by absorbing light in the green wavelength range in the active layer 1530, and light in the other wavelength range may pass through the first electrode 1510 to be sensed by the light sensing elements 1550B and 1550R.

As described above, by having a structure in which a photoelectric element selectively absorbing and/or sensing light in the green wavelength range may be stacked, a size of an image sensor may be reduced to realize a smaller light receiver 60.

Figure 26:
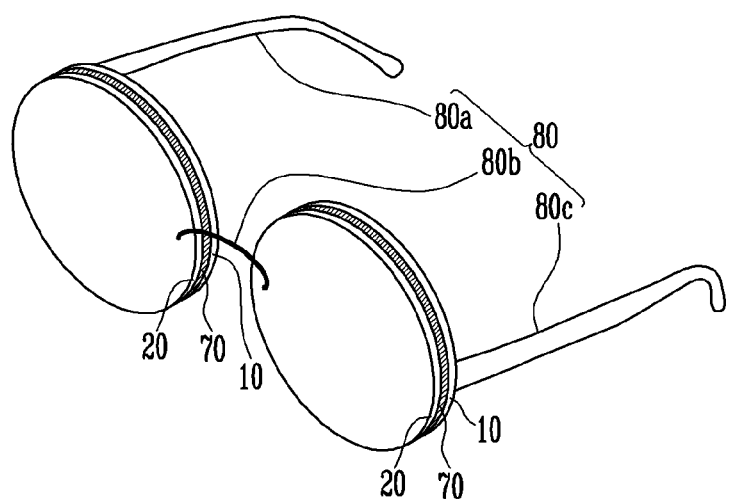
FIGS. 26 and 27 are schematic representations that show other applications of a display device according to embodiments of the invention.
Figure 27:
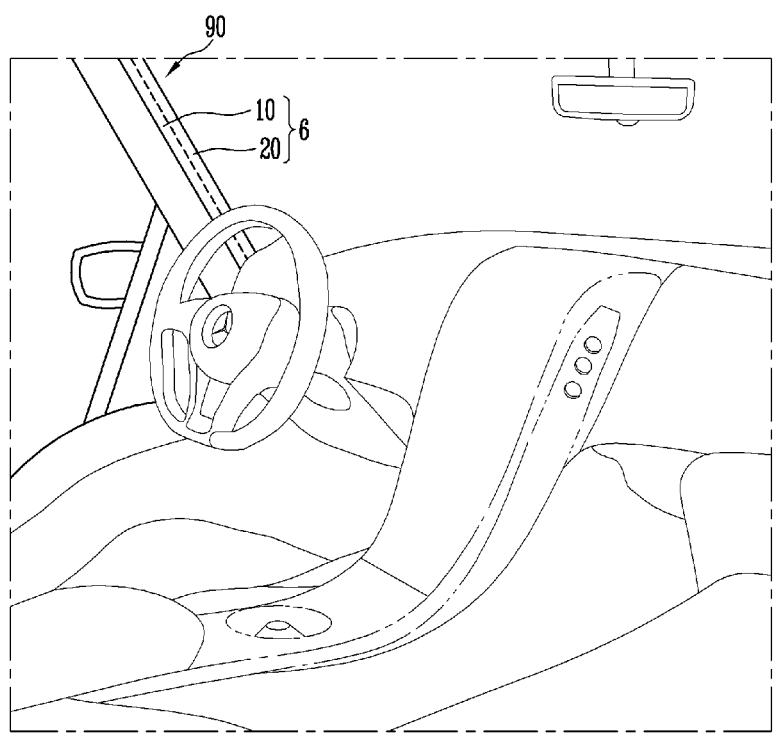

FIGS. 26 and 27 are schematic representations that show other applications of a display device according to embodiments of the invention.

A display device 5 according to an embodiment of the invention may be applied to a wearable device as shown in FIG. 26. FIG. 26 shows an AR-Glass as a wearable device. A lens of the AR-Glass may include a display part 10 and a light receiver 20, and may further include a battery 70 that may be interposed between the display part 10 and the light receiver 20. The display part 10, the light receiver 20 and the battery 70 may be fixed by frames 80 (80a, 80b, and 80c)

A display device 6 according to an embodiment of the invention may be applied to at least portion of a car frame as shown in FIG. 27

FIG. 27 shows a case applying the display device 6 of the invention to an A-pillar 90 of an automobile. The display device 6 according to an embodiment may be applied to the A-pillar 90 of the automobile to help secure a driver's view.

Figure 28:
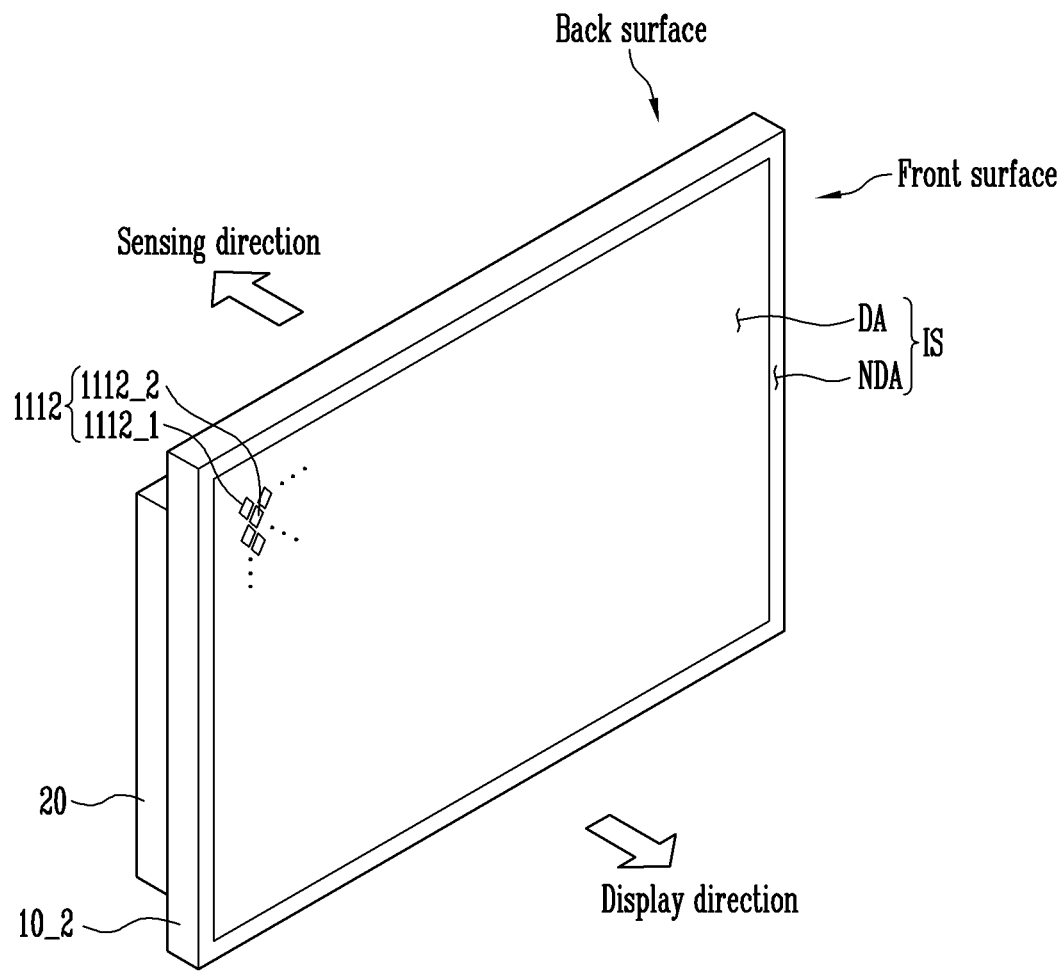
FIG. 28 is a schematic perspective view showing a front surface of a display device according to another embodiment.
Figure 29:
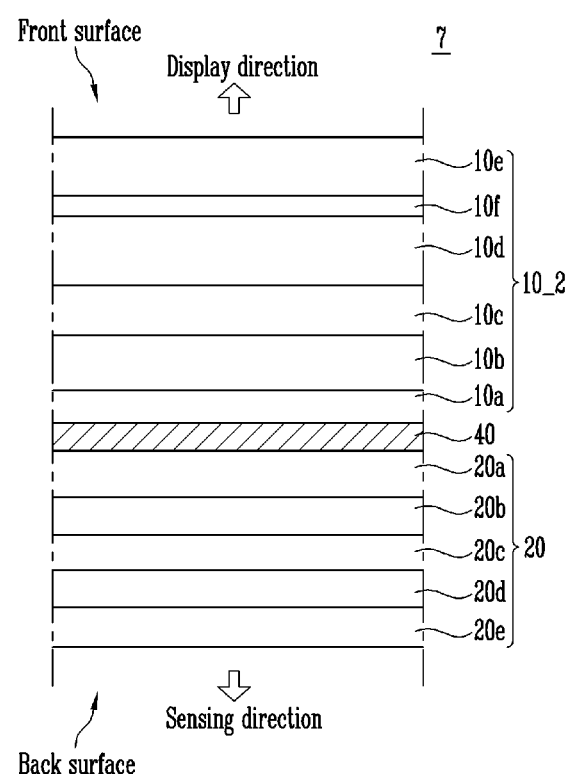
FIG. 29 is a schematic cross-sectional view of a display device of FIG. 28.
Figure 30:
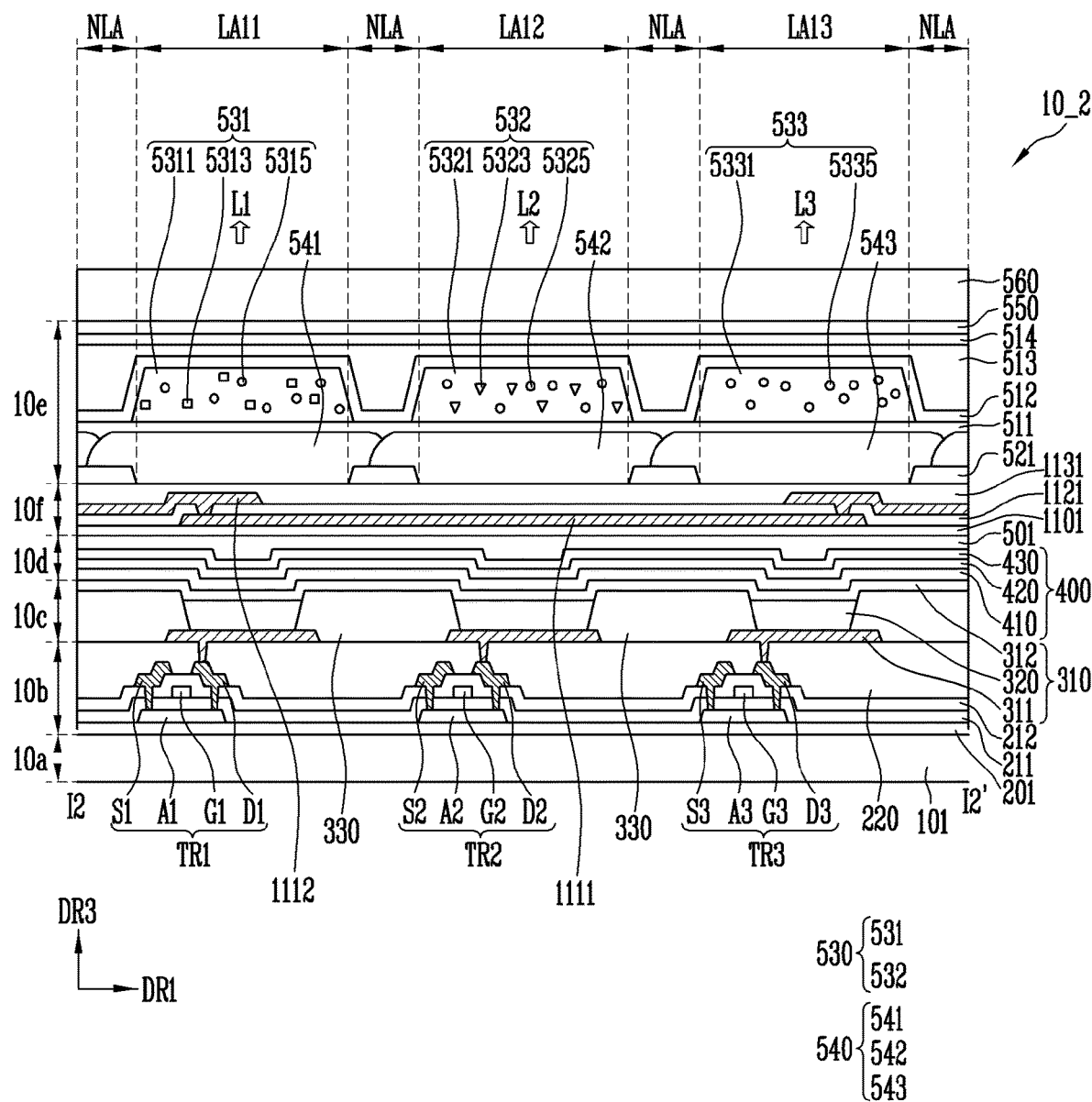
FIG. 30 is schematic a cross-sectional view of a display part of FIG. 29.

FIG. 28 is a schematic perspective view showing a front surface of a display device according to another embodiment. FIG. 29 is a schematic cross-sectional view of a display device of FIG. 28. FIG. 30 is a schematic cross-sectional view of a display part of FIG. 29.

Referring to FIGS. 28 to 30, a display device 7 according to an embodiment may be different from the embodiment of FIGS. 1, 10, and 11 in that the display part 10_2 may further include a touch part 10f.

In an embodiment, the touch part 10f may be disposed between the first encapsulation layer 10d and the color conversion element layer 10e. The touch part 10f may include sensing electrodes 1112.

The sensing electrodes 1112 may sense a touch by a user's body, a hovering, a gesture, proximity, and the like. The sensing electrodes 1112 may be formed in different shapes according to various methods such as a resistive type, a capacitive type, an electro-magnetic type (EM), an optical type, and the like. For example, in case that the sensing electrodes 1112 may be formed in a capacitive type, the sensing electrodes 1112 may be formed in a self-capacitive type, a mutual capacitive type, or the like.

In case that the sensing electrodes 1112 may be formed in a self-capacitive type, each sensing electrode 1112 may be driven independently, and a sensing signal corresponding to the capacitance formed by each sensing electrode 1112 and the user's body may be provided to corresponding connection lines (not shown).

In case that the sensing electrodes 1112 may be formed in a mutual capacitive type, a sensing signal may be received through a connection line corresponding to the first sensing electrode 1112_1, and a driving signal may be transferred through a connection line corresponding to the second sensing electrode 1112_2 that forms mutual capacitance with the first sensing electrode 1112_1. Although not explicitly shown, each sensing electrode 1112 disposed outside may be connected (e.g., directly connected) to a corresponding connection line. In case that the user's body may be close, the mutual capacitance between the first sensing electrode 1112_1 and the second sensing electrode 1112_2 may change. Therefore, whether the user touches may be detected according to a difference of the sensing signal depending thereon.

In an embodiment, the sensing electrodes 1112 may be plate-shaped electrodes of a rhombus shape. The sensing electrodes 1112 may include a transparent conductive material such as indium tin oxide (ITO), indium zinc oxide (IZO), zinc oxide (ZnO), indium tin zinc oxide (ITZO), or the like.

However, the sensing electrodes 1112 may not limited to the shape, and may be mesh shapes in another embodiment. The sensing electrodes 1112 may be at least one metal selected from the group of molybdenum (Mo), aluminum (Al), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu).

A touch buffer layer 1101 may be disposed on the first encapsulation layer 10d. The touch buffer layer 1101 may smooth a surface of the first encapsulation layer 10d and prevent penetration of moisture or outside air. The touch buffer layer 1101 may be an inorganic layer. The touch buffer layer 1101 may be a single layer or multiple layer.

A bridge electrode 1111 may be formed on the touch buffer layer 1101. The bridge electrode 1111 may perform a function of electrically connecting adjacent first sensing electrodes 1112_1 or adjacent second sensing electrodes 1112_2. The bridge electrode 1111 may be at least one metal selected from the group of molybdenum (Mo), aluminum (Al), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu).

A first touch insulation layer 1121 may be disposed on the bridge electrode 1111. A first touch insulation layer 1121 may include a contact hole exposing at least a portion of the bridge electrode 1111.

The sensing electrodes 1112 may be disposed on the first touch insulation layer 1121. The first sensing electrodes 1112_1 may be disposed to extend in the first direction DR1 in a plan view, and the second sensing electrodes 1112_2 may be disposed to extend in the second direction DR2 in a plan view. Since the first sensing electrodes 1112_1 and the second sensing electrodes 1112_2 cross each other and may be disposed on the same layer, one of the two sensing electrodes 1112 may be electrically connected through the bridge electrode 1111 to prevent a short circuit.

A second touch insulation layer 1131 may be disposed on the sensing electrodes 1112. The first touch insulation layer 1121 and the second touch insulation layer 1131 may include silicon oxide (SiOx), silicon nitride (SiNx), silicon oxynitride, aluminum oxide, tantalum oxide, hafnium oxide, zirconium oxide, titanium oxide, or the like. These may be used alone or in combination with each other. The first touch insulation layer 1121 and the second touch insulation layer 1131 may be a single layer or a multiple layer formed of a stacked layer of different materials.

While embodiments of the invention are described with reference to the attached drawings, those with ordinary skill in the technical field of the invention pertains will be understood that the invention may be carried out in other specific forms without changing the technical idea or essential features. Accordingly, the above-described embodiments should be considered in descriptive sense only and not for purposes of limitation.

What is claimed is:

1. A display device comprising:
   a display substrate;
   a light emitting element layer disposed on a surface of the display substrate and including display pixels and transistors, wherein no holes pass through the display substrate at a location directly beneath the display pixels;
   a sensing substrate having a surface attached to another surface of the display substrate;
   a sensing element layer disposed on another surface of the sensing substrate and including sensing pixels that each sense light of a color; and
   a photorefractive layer disposed on the sensing element layer and including micro lenses.

2. The display device of claim 1, further comprising:
   a color conversion element layer disposed on the light emitting element layer, wherein the color conversion element layer includes:
   a wavelength conversion pattern that includes a quantum dot; and a color filter, wherein
the color filter, the quantum dot, and the light emitting element layer are disposed on different layers.

3. The display device of claim 1, wherein the display substrate and the sensing substrate are flexible.

4. The display device of claim 3, further comprising:
a first encapsulation layer disposed on the light emitting element layer; and
a second encapsulation layer disposed between the sensing element layer and the photorefractive layer,
wherein each of the first encapsulation layer and the second encapsulation layer includes a first inorganic layer, an organic layer, and a second inorganic layer.

5. The display device of claim 1, wherein the display substrate and the sensing substrate are bonded together using an opaque adhesive.

6. The display device of claim 1, wherein the display pixels include an organic light emitting diode, and the sensing pixels include a photo diode.

7. The display device of claim 6, wherein the organic light emitting diode of the display pixels emits blue light.

8. The display device of claim 6, wherein the organic light emitting diode and the photo diode are formed in a same process.

9. The display device of claim 1, further comprising:
a controller that controls the display pixels and the sensing pixels.

10. The display device of claim 9, wherein the controller includes:
an image processor that performs color processing on image data decoded from the sensing pixels and performs at least one of an image conversion and an image quality improvement.

11. The display device of claim 1, wherein the sensing pixels include:
a first photoelectric conversion element that senses red light;
a second photoelectric conversion element that senses green light; and
a third photoelectric conversion element that senses blue light.

12. The display device of claim 11, wherein
the first photoelectric conversion element includes phthalocyanine,
the second photoelectric conversion element includes boron subphthalocyanine chloride or N, N-dimethyl quinacridone, and
the third photoelectric conversion element includes triarylamines or oxadiazole-containing oligoaryls.

13. The display device of claim 1, wherein at least one of the micro lenses of the photorefractive layer overlaps at least one photoelectric conversion element of the sensing pixels.

14. The display device of claim 1, further comprising:
a color conversion filter disposed between the sensing element layer and the photorefractive layer.

15. The display device of claim 14, wherein the sensing pixels absorb light of one color.

16. The display device of claim 15, wherein the color conversion filter includes:
a first color filter that selectively transmits light of a first color;
a second color filter that selectively transmits light of a second color; and
a third color filter that selectively transmits light of a third color.

17. The display device of claim 1, wherein each of the sensing pixels includes a light sensing element of an organic CMOS image sensor.

18. The display device of claim 1, wherein the display substrate and the sensing substrate are integrally formed.

19. A display device comprising: a display substrate; a display surface formed on a surface of the display substrate and including a plurality of color areas defined by display pixels; transistors on the display substrate to drive the display pixels; and a sensing surface formed on another side of the display substrate and including a plurality of absorption areas defined by sensing pixels, wherein the display substrate does not include a hole passing through the display substrate in the display area, each of the display pixels includes a light emitting element, each of the sensing pixels includes a photoelectric conversion element, and a number of the display pixels is equal to a number of the sensing pixels.

20. The display device of claim 19, wherein
the display pixels match one-to-one with the sensing pixels, and
an image color collected by one of the sensing pixels is emitted through a corresponding display pixel.

21. The display device of claim 19, wherein the display surface includes:
a display area; and
a non-display area surrounding the display area, and the display area includes:
a light emitting area including the plurality of color areas; and
a non-light emitting area distinguishing the plurality of color areas.

22. The display device of claim 21, wherein the display device does not include a physical opening passing through the display device in the display area.

23. The display device of claim 19, wherein an area of the sensing surface is less than an area of the display surface.

24. The display device of claim 19, wherein the plurality of color areas includes:
a first color area that selectively emits light of a first color;
a second color area that selectively emits light of a second color; and
a third color area, that selectively emits light of a third color.

25. The display device of claim 24, wherein the first color area, the second color area, and the third color area have different sizes with each other.

26. The display device of claim 19, wherein sizes of the plurality of absorption areas are substantially same as each other and are less than or equal to sizes of the plurality of color areas.

* * * * *